US012362970B2

(12) United States Patent
Ying

(10) Patent No.: US 12,362,970 B2
(45) Date of Patent: Jul. 15, 2025

(54) ADAPTIVE PRESET-BASED FEED-FORWARD EQUALIZATION

(71) Applicant: PARADE TECHNOLOGIES, LTD, San Jose, CA (US)

(72) Inventor: Canruo Ying, Santa Clara, CA (US)

(73) Assignee: PARADE TECHNOLOGIES, LTD., San Jose, CA (US)

(*) Notice: Subject to any disclaimer, the term of this patent is extended or adjusted under 35 U.S.C. 154(b) by 0 days.

(21) Appl. No.: 18/191,851

(22) Filed: Mar. 28, 2023

(65) Prior Publication Data

US 2024/0333559 A1 Oct. 3, 2024

(51) Int. Cl.
| H04L 25/03 | (2006.01) |
| H03H 17/00 | (2006.01) |
| H03H 17/02 | (2006.01) |

(52) U.S. Cl.
CPC ....... *H04L 25/03057* (2013.01); *H03H 17/02* (2013.01); *H03H 2017/0081* (2013.01)

(58) Field of Classification Search
CPC ............... H03H 17/02; H03H 17/0248; H03H 17/0255; H03H 17/0261; H03H 17/0269; H03H 2017/0081; H03H 2021/0079; H04L 25/026; H04L 25/03; H04L 25/03006; H04L 25/03019; H04L 25/03057; H04L 25/03885; H04L 2025/03681
USPC .................. 375/232, 233, 257; 708/322, 323
See application file for complete search history.

(56) References Cited

U.S. PATENT DOCUMENTS

| 5,159,565 | A | * | 10/1992 | Bune ................. H04L 25/03038 708/319 |
| 5,191,547 | A | * | 3/1993 | Kawamoto ........ H03H 17/0664 708/313 |
| 5,416,799 | A | * | 5/1995 | Currivan ............ H03H 21/0012 375/232 |
| 6,351,457 | B1 | * | 2/2002 | Sugiyama ................ H04B 3/23 370/290 |
| 11,588,668 | B2 | * | 2/2023 | Muehlmann ...... H04L 25/03019 |
| 2009/0238380 | A1 | * | 9/2009 | Brannmark ............. H04S 7/301 381/98 |
| 2011/0243575 | A1 | * | 10/2011 | Yan ..................... H04L 25/0305 398/205 |
| 2018/0329072 | A1 | * | 11/2018 | Anderson ............... G01S 19/30 |

* cited by examiner

Primary Examiner — Young T. Tse
(74) Attorney, Agent, or Firm — Morgan, Lewis & Bockius LLP

(57) ABSTRACT

This application discloses adaptively setting feed-forward equalization (FFE) for a data communication channel. An equalization signal is generated using a finite impulse response (FIR) filter that has a plurality of FIR coefficients configured to be defined by one of a plurality of preset configurations. A lookup table has a plurality of rows, and each row is associated with a different preset configuration of the FIR coefficients and identifies a subset of respective preset configurations corresponding to a subset of FIR coefficients. In some implementations, a temporal sequence of preset configurations of the FIR coefficients is selected from the lookup table, until a predefined equalization criterion is satisfied. In some implementations, residual errors are determined and correspond to signal samples of the equalization signal, and a sequence of preset configurations of the FIR coefficients is selected from the lookup table based on the residual errors.

20 Claims, 15 Drawing Sheets

| Preset Configuration # | Preshoot (dB) | De-emphasis (dB) | Informative Filter Coefficients | | |
|---|---|---|---|---|---|
| | | | $C_{-1}$ | $C_0$ | $C_{+1}$ |
| 0 | 0 | 0 | 0 | 1 | 0 |
| 1 | 0 | -1.9 | 0 | 0.9 | -0.1 |
| 2 | 0 | -3.6 | 0 | 0.83 | -0.17 |
| 3 | 0 | -5.0 | 0 | 0.78 | -0.22 |
| 4 | 0 | -8.4 | 0 | 0.69 | -0.31 |
| 5 | 0.9 | 0 | -0.05 | 0.95 | 0 |
| 6 | 1.1 | -1.9 | -0.05 | 0.86 | -0.09 |
| 7 | 1.4 | -3.8 | -0.05 | 0.79 | -0.16 |
| 8 | 1.7 | -5.8 | -0.05 | 0.73 | -0.22 |
| 9 | 2.1 | -8.0 | -0.05 | 0.68 | -0.27 |
| 10 | 1.7 | 0 | -0.09 | 0.91 | 0 |
| 11 | 2.2 | -2.2 | -0.09 | 0.82 | -0.09 |
| 12 | 2.5 | -3.6 | -0.09 | 0.77 | -0.14 |
| 13 | 3.4 | -6.7 | -0.09 | 0.69 | -0.22 |
| 14 | 3.6 | 0 | -0.17 | 0.83 | 0 |
| 15 | 1.7 | -1.7 | -0.05 | 0.55 | -0.05 |

Figure 4B

| Preset | C[-1] | C[0] | C[1] |
|---|---|---|---|
| 0 | 0 | 1 | 0 |
| 1 | 0 | 0.9 | -0.1 |
| 2 | 0 | 0.83 | -0.17 |
| 3 | 0 | 0.78 | -0.22 |
| 4 | 0 | 0.69 | -0.31 |
| 5 | -0.05 | 0.95 | 0 |
| 6 | -0.05 | 0.86 | -0.09 |
| 7 | -0.05 | 0.79 | -0.16 |
| 8 | -0.05 | 0.73 | -0.22 |
| 9 | -0.05 | 0.68 | -0.27 |
| 10 | -0.09 | 0.91 | 0 |
| 11 | -0.09 | 0.82 | -0.09 |
| 12 | -0.09 | 0.77 | -0.14 |
| 13 | -0.09 | 0.69 | -0.22 |
| 14 | -0.17 | 0.83 | 0 |
| 15 | -0.05 | 0.55 | -0.05 |

Figure 8A

| P_current | C[-1] up | C[-1] down | C[1] up | C[1] down |
|---|---|---|---|---|
| 0 | 0 | 5 | 0 | 1 |
| 1 | 1 | 6 | 0 | 2 |
| 2 | 2 | 7 | 1 | 3 |
| 3 | 3 | 8 | 2 | 4 |
| 4 | 4 | 9 | 3 | 4 |
| 5 | 0 | 10 | 5 | 6 |
| 6 | 1 | 11 | 5 | 7 |
| 7 | 2 | 12 | 6 | 8 |
| 8 | 3 | 13 | 7 | 9 |
| 9 | 4 | 13 | 8 | 9 |
| 10 | 5 | 14 | 10 | 11 |
| 11 | 6 | 14 | 10 | 12 |
| 12 | 7 | 14 | 11 | 13 |
| 13 | 8 | 14 | 12 | 13 |
| 14 | 10 | 14 | 14 | 14 |
| 15 | 15 | 15 | 15 | 15 |

Figure 8B

| P_current | C[-2] up | C[-2] down | C[-1] up | C[-1] down | C[1] up | C[1] down |
|---|---|---|---|---|---|---|
| 0 | 0 | 0 | 0 | 4 | 0 | 1 |
| 1 | 1 | 1 | 1 | 5 | 0 | 2 |
| 2 | 2 | 2 | 2 | 6 | 1 | 3 |
| 3 | 3 | 3 | 3 | 7 | 2 | 3 |
| 4 | 4 | 4 | 0 | 8 | 4 | 5 |
| 5 | 5 | 5 | 1 | 9 | 4 | 6 |
| 6 | 6 | 6 | 2 | 10 | 5 | 7 |
| 7 | 7 | 7 | 3 | 11 | 6 | 7 |
| 8 | 8 | 8 | 4 | 12 | 8 | 9 |
| 9 | 9 | 9 | 5 | 13 | 8 | 10 |
| 10 | 10 | 10 | 6 | 14 | 9 | 11 |
| 11 | 11 | 11 | 7 | 15 | 10 | 11 |
| 12 | 16 | 12 | 8 | 20 | 12 | 13 |
| 13 | 17 | 13 | 9 | 21 | 12 | 14 |
| 14 | 18 | 14 | 10 | 22 | 13 | 15 |
| 15 | 19 | 15 | 11 | 23 | 14 | 15 |
| 16 | 16 | 12 | 8 | 24 | 16 | 17 |
| 17 | 17 | 13 | 9 | 25 | 16 | 18 |
| 18 | 18 | 14 | 10 | 26 | 17 | 19 |
| 19 | 19 | 15 | 11 | 27 | 18 | 19 |
| 20 | 24 | 20 | 12 | 32 | 20 | 21 |
| 21 | 25 | 21 | 13 | 33 | 20 | 22 |
| 22 | 26 | 22 | 14 | 33 | 21 | 23 |
| 23 | 27 | 23 | 15 | 33 | 22 | 23 |
| 24 | 28 | 20 | 16 | 34 | 24 | 25 |
| 25 | 29 | 21 | 17 | 35 | 24 | 26 |
| 26 | 30 | 22 | 18 | 35 | 25 | 27 |
| 27 | 31 | 23 | 19 | 35 | 26 | 27 |
| 28 | 28 | 24 | 16 | 36 | 28 | 29 |
| 29 | 29 | 25 | 17 | 37 | 28 | 30 |
| 30 | 30 | 26 | 18 | 37 | 29 | 31 |
| 31 | 31 | 27 | 19 | 37 | 30 | 31 |
| 32 | 34 | 32 | 20 | 32 | 32 | 33 |
| 33 | 35 | 33 | 21 | 33 | 32 | 33 |
| 34 | 36 | 32 | 24 | 34 | 34 | 35 |
| 35 | 37 | 33 | 25 | 35 | 34 | 35 |
| 36 | 38 | 34 | 28 | 36 | 36 | 37 |
| 37 | 39 | 35 | 29 | 37 | 36 | 37 |
| 38 | 38 | 36 | 28 | 38 | 38 | 39 |
| 39 | 39 | 37 | 29 | 39 | 38 | 39 |

Figure 9B

ADAPTIVE PRESET-BASED FEED-FORWARD EQUALIZATION

TECHNICAL FIELD

The disclosed embodiments relate generally to data transmission technology including, but not limited to, methods, systems, and devices for configuring high speed data interfaces for data communication between two electronic devices or components using a high-speed serial expansion bus.

BACKGROUND

Many electronic devices are physically coupled to each other and communicate with each other using data links and interfaces that comply with high-speed serial computer expansion bus standards (e.g., Peripheral Component Interconnect (PCI) Express). These bus standards allow application of retimers and redrivers to extend a channel reach at a high data speed. A redriver is an analog extension device designed to boost portions of a signal to counteract attenuation caused by signal propagation over a physical interconnect of a corresponding data link. A retimer is a mixed-signal device that is standard-aware and has an ability to fully recover the data, extract the embedded clock, and retransmit a fresh copy of the data using a clean clock. Compared with the redriver, the retimer actively participates in applying the bus standard to implement negotiation, timeouts, bit manipulation, jitter resetting, signal equalization, skew correction, and many other functions. Feed-forward equalization (FFE) is commonly used to compensate an insertion loss in the data links, and a plurality of preset filter coefficients are applied to enable different FFE results. However, the plurality of preset filter coefficients forms an ordered sequence of filter coefficient sets that does not maintain monotonicity and orthogonality, which makes it difficult to identify a desirable filter preset coefficient that optimizes performance of the data links. It would be beneficial to have a more effective equalization mechanism in data links and interfaces using the high-speed serial computer expansion bus standards than the current practice.

SUMMARY

This application is directed to methods, electronic systems, electronic devices, electronic circuits, data links, data ports, and data interfaces that adaptively set up feed-forward equalization (FFE) for a data communication channel. In some embodiments, the data communication channel complies with a high-speed data communication protocol (e.g., Universal Serial Bus (USB) 4 v1.0, USB4 v2.0 Gen 4, Pulsed Amplitude Modulation-3 (PAM-3), DisplayPort 2.1 or PCIe), which defines a list of FFE configurations using a preset configuration table. FFE is implemented by a transversal filter that generates a finite impulse response (FIR) and improves signal quality by reducing intersymbol interference (ISI). The transversal filter is also called an FIR filter. The FIR filter includes a set of unit delay cells and weighted segments associated with delay taps. In accordance with the high-speed data communication protocol, the preset configuration table outlines a number of delay taps and coefficient weights associated with the FIR filter. A mapping procedure is introduced to transform the preset configuration table to a lookup table, allowing a Stochastic gradient descent (SGD) based method to be applied based on a list of FFE configurations of the lookup table (which is non-monotonic and non-orthogonal). In some embodiments, a data transceiver is re-configured with two or more different FFE preset configuration tables (e.g., DisplayPort 2.1 and USB4 2.0), thereby enabling functionality across multiple data communication protocols or generations.

In one aspect, a method is implemented to adaptively set FFE for a data communication channel. The method includes generating an equalization signal using a finite impulse response (FIR) filter. The FIR filter has a plurality of FIR coefficients configured to be defined by one of a plurality of preset configurations. The method further includes obtaining a lookup table having a plurality of rows. Each row is associated with a different preset configuration of the FIR coefficients and identifies a subset of respective preset configurations corresponding to a subset of FIR coefficients. The method further includes determining a plurality of residual errors corresponding to a plurality of signal samples of the equalization signal and selecting a temporal sequence of preset configurations of the FIR coefficients from the lookup table based on the plurality of residual errors.

In another aspect, a method is implemented to adaptively set FFE for a data communication channel. The method includes generating an equalization signal using a finite impulse response (FIR) filter. The FIR filter has a plurality of FIR coefficients configured to be defined by one of a plurality of preset configurations. The method further includes obtaining a lookup table having a plurality of rows. Each row is associated with a different preset configuration of the FIR coefficients and identifies a subset of respective preset configurations corresponding to a subset of FIR coefficients. The method further includes dynamically and in real time, while generating the equalization signal, selecting a temporal sequence of preset configurations of the FIR coefficients from the lookup table, until a predefined equalization criterion 350 is satisfied.

In some embodiments, the data communication channel is configured to comply with a Universal Serial Bus (USB) standard. The plurality of FIR coefficients includes four FIR coefficients $C_{-2}$, $C_{-1}$, $C_0$, $C_{+1}$, and the subset of FIR coefficients applied to define the lookup table includes three FIR coefficients $C_{-2}$, $C_{-1}$, and $C_{+1}$. Further, in some embodiments, the plurality of preset configurations includes 40 preset configurations for the plurality of FIR coefficients. The lookup table defines, for each preset configuration of the FIR coefficients, six preset configurations corresponding to an increase direction of $C_{-2}$, a decrease direction of $C_{-2}$, an increase direction of $C_{-1}$, a decrease direction of $C_{-1}$, an increase direction of $C_{+1}$, and a decrease direction of $C_{+1}$.

In some embodiments, the data communication channel is configured to comply with a DisplayPort standard, and wherein the plurality of FIR coefficients includes three FIR coefficients $C_{-1}$, $C_0$, and $C_{+1}$, and the subset of FIR coefficients applied to define the lookup table includes two FIR coefficients $C_{-1}$ and $C_{+1}$. Further, in some embodiments, the plurality of preset configurations includes 16 preset configurations for the plurality of FIR coefficients. The lookup table defines, for each preset configuration of the FIR coefficients, four preset configurations corresponding to an increase direction of $C_{-1}$, a decrease direction of $C_{-1}$, an increase direction of $C_{+1}$, and a decrease direction of $C_{+1}$.

In some embodiments, the predefined equalization criterion is satisfied in accordance with a determination of one of a group of conditions consisting of: a predetermined duration of time having passed in response to an equalization instruction, a predefined first number of consecutive preset configurations in the temporal sequence including the same preset configuration, a predefined second number of consecutive preset configurations in the temporal sequence varying between two distinct preset configurations, the temporal sequence of preset configurations reaching a predefined third number of preset configurations, and a subsequent system or data transmission instruction being received to terminate equalization.

In another aspect, a non-transitory computer-readable medium stores one or more programs to be executed by one or more processors for adaptively setting FFE for a data communication channel. The one or more programs include instructions for implementing any of the above methods.

In yet another aspect, an electronic device includes one or more processors for adaptively setting FFE for a data communication channel and memory storing one or more programs configured for execution by the one or more processors. The one or more programs includes instructions for implementing any of the above methods.

In yet another aspect, an electronic system includes a FIR filter, memory storing a lookup table, a controller, and a function mapping module. The FIR filter is configured to generate an equalization signal. The FIR filter has a plurality of FIR coefficients configured to be defined by one of a plurality of preset configurations. The lookup table has a plurality of rows, and each row is associated with a different preset configuration of the FIR coefficients and identifies a subset of preset configurations corresponding a subset of FIR coefficients. The controller is coupled to the FIR filter and configured to determine a plurality of residual errors corresponding to a plurality of signal samples of the equalization signal. The function mapping module is coupled to the controller, FIR filter, and memory, and is configured to select a sequence of preset configurations of the FIR coefficients from the lookup table based on the plurality of residual errors.

These illustrative embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 4B is an example FFE preset table including a plurality of preset configurations of FIR coefficients (e.g., $C_{+1}$, $C_0$, $C_{-1}$) in compliance with a data transmission standard (e.g., DisplayPort 2.1), in accordance with some embodiments.

FIGS. 8A and 8B are an example FFE preset table and an example lookup table corresponding to a first data communication standard (e.g., DisplayPort 2.1), in accordance with some embodiments.

FIGS. 9A and 9B are another example FFE preset table and another example lookup table corresponding to a second data communication standard (e.g., USB4 v2.0), in accordance with some embodiments.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
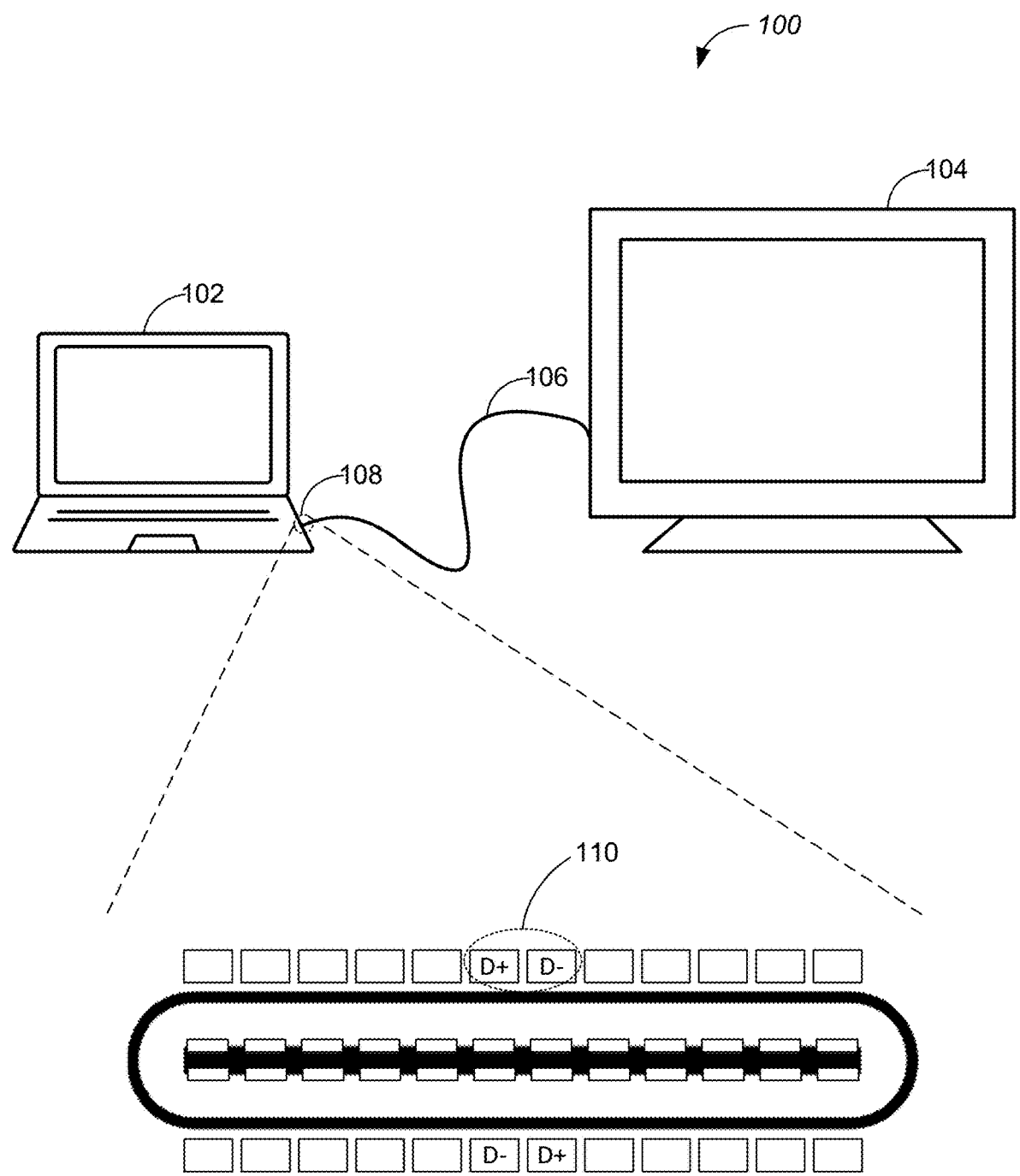
FIG. 1 is a block diagram of an example electronic system in which electronic devices are electrically via a data link, in accordance with some embodiments.

FIG. 1 is a block diagram of an example electronic system 100 in which a first electronic device 102 is electrically coupled to a second electronic device 104 via a data link 106, in accordance with some embodiments. The first electronic device 102 and second electronic device 104 are configured to exchange data via the data link 106. In an example, the first electronic device 102 includes a video source, and the second electronic device 104 includes a display device. The display device has a screen configured to display visual content provided by the first electronic device 102 via the data link 106. In another example not shown, the first electronic device 102 includes a desktop computer, and the second electronic device 104 includes a mobile phone that exchanges data with the desktop computer via the data link 106. Examples of the electronic devices 102 and 104 include, but are not limited to, a desktop computer, a laptop computer, a tablet computer, a video player, a camera device, a gameplayer device, or other formats of electronic devices which are configured to provide data or receive data. Video data, audio data, text, program data, control data, configuration data, or any other data are transmitted between the first and second electronic devices 102 and 104 via the data link 106.

The data link 106 includes two connectors 108 at two of its ends. The two connectors 108 are configured to connect the data link 106 to respective connectors 108 of the first electronic device 102 and second electronic device 104. For example, the connector 108 is a DisplayPort connector having a digital display interface developed by a consortium of personal computer and chip manufacturers and standardized by the Video Electronics Standards Association (VESA). The DisplayPort connector is configured to connect the data link 106 to the first electronic device 102 and carry video, audio, and control data according to a data communication protocol. In another example, the connector 108 is a universal serial bus (USB) connector, e.g., configured to connect a computer to a peripheral device. Exemplary types of the USB connector include, but are not limited to, USB-A, USB-B, USB-C, USB Micro-A, USB Micro-B, USB Mini-B, USB 3.0A, USB 3.0B, USB 3.0 Micro B, and USB Micro-AB. Further, a data communication protocol of USB4 is applied to communicate data using a USB-C connector, thereby providing a throughput of up to 40 Gbps, power delivery of up to 100 W, support for 4K and 5K displays, and backward compatibility with USB 3.2 and USB 2.

In some embodiments, the connector 108 includes a bidirectional channel for communicating a stream of data between the first and second electronic device 102 and 104. The bidirectional channel of the connector 108 includes two data lanes and a pair of differential pins 110 coupled to the two data lanes. The pair of differential pins 110 are configured to receive a differential input signal from the first electronic device 102 or the second electronic device 104, and the differential input signal carries a serial data command or serial content data (e.g., video or audio data) that are communicated via the two data lanes of the connector 108. As such, the two data lanes and pair of differential pins 110 of the connector 108 are configured to facilitate bidirectional communication between the first electronic device 102 and the second electronic device 104. The bidirectional channel is a data channel or an auxiliary channel. Specifically, the auxiliary channel of the connector 108 is used for communication of additional serial data beyond video and audio data, such as consumer electronics control (CEC) commands. In some embodiments, the pair of differential pins 110 is coupled to a dedicated set of twisted-pair wires configured to carry two input signals of the differential input signal.

Each connector 108 of the data link 106 is configured to be coupled to a respective connector 108 of the first electronic device 102 and a respective connector 108 of the second electronic device 104. Each connector 108 of the data link 106 is bidirectional, so is each respective connector 108 of the electronic devices 102 and 104. When the connector 108 of the data link 106 is coupled to the first or second electronic device 102 or 104, the pair of differential pins 110 of the connector 108 of the data link 106 are physically and electrically coupled to a pair of differential pins 110 of the connector 108 of the first or second electronic device 102 or 104. The pair of differential pins 110 of the connector 108 of the first or second electronic device 102 or 104 is configured to receive data from, or transmit data to, the differential pins 110 of the connector 108 of the data link 106.

Figure 2:
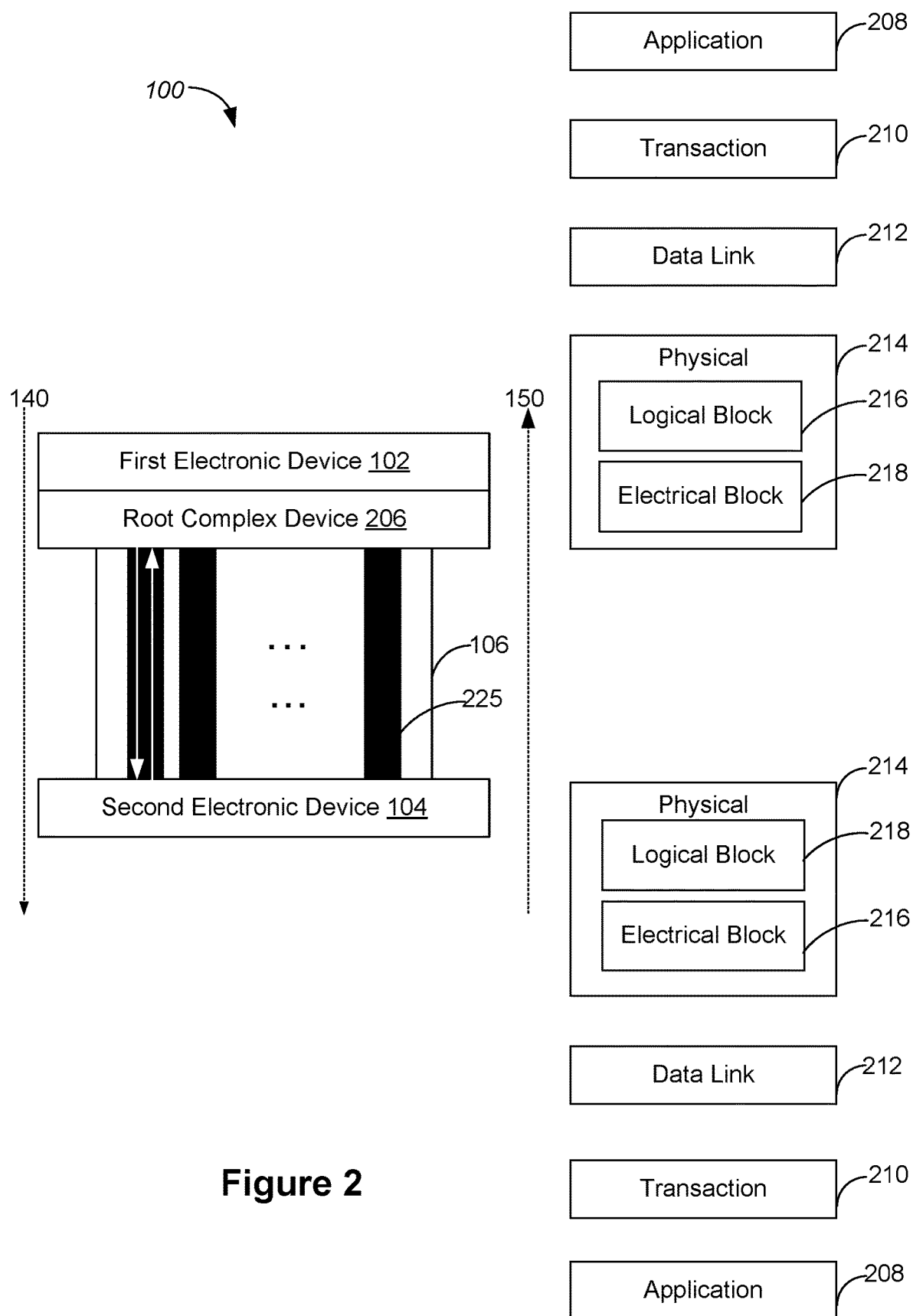
FIG. 2 is an example PCI Express electronic system in which a first electronic device or component is electrically coupled to a second electronic device or component via a data link, in accordance with some implementations.

FIG. 2 is an example PCI Express electronic system 100 in which a first electronic device or component 102 is electrically coupled to a second electronic device or component 104 via a data link 106, in accordance with some implementations. In an example, the first electronic device 102 includes a central processing unit (CPU) of a personal computer, and the second electronic device 104 is a peripheral component of the personal computer, such as a graphics card, a hard drive, a solid state drive, a Wi-Fi communication module, or an Ethernet card. The data link 106 includes a connection port for receiving from the second electronic device 104. The connection port is optionally formed on a mother board of the personal computer. The data link 106 complies with PCI Express (i.e., PCIe), which is a high-speed serial computer expansion bus standard, and provides an interface to communicate data packets between the first and second electronic devices 102 and 104 in compliance with the PCI Express. The data link 106 is a serial data bus including one or more data transmission channels 225. Each channel 225 includes two wire sets for transmitting and receiving data packets, thereby supporting full-duplex communication between the first and second electronic devices 102 and 104. In some examples, the data link 106 has 1, 4, 8, or 16 channels 225 coupled in a single data port of the data link 106. For each lane, the two wire sets correspond to a downstream data direction 140 or an upstream data direction 150 defined with respect to the first electronic device 102. Optionally, each wire set includes two wires for carrying a pair of differential signals.

In some implementations, the first electronic device 102 includes or is coupled to a root complex device 206 that is further coupled to the data link 106. The root complex device 206 is configured to generate requests for transactions including a series of one or more packet transmissions on behalf of the first electronic device 102. Examples of the transactions include, but are not limited to, Memory Read, Memory Read Lock, IO Read, IO Write, Configuration Read, Configuration Write, and Message. In some implementations, the first electronic device 102 is coupled to one or more additional electronic devices besides the second electronic device 104. The data link 106 includes one or more switch devices to couple the root complex device 206 of the first electronic device 102 to multiple endpoints including the second electronic device 104 and additional electronic devices not shown in FIG. 1.

PCI Express is established based on a layered model including an application layer 208, a transaction layer 210, a data link layer 212, and a physical layer 214. As the top layer, the application layer 208 is implemented in software programs, such as Ethernet, NVMe, SOP, AHCI, and SATA. In the transaction layer 210, each transaction of a series of packet transmissions is implemented as requests and responses separated by time. For example, a memory-related transaction is translated to device configuration and control data transferred to or from the second electronic device 104 (e.g., a memory device). Data packets associated with each transaction are managed by data flows on the data link layer 212. The physical layer 214 of PCI Express controls link training and electrical (analog) signaling, and includes a logical block 116 and an electrical block 118. The logic block 116 defines ordered data sets in training states (e.g., TS1 and TS2), and the electrical block 118 defines eye diagram characteristics and analog waveforms. Each layer of the layered model includes first specifications for a transmitting end where a root complex device 206 is coupled and second specifications for a receiving end where a peripheral component (i.e., the second electronic device 104) is coupled.

As high frequency signals are transmitted within the channels 225 of the data link 106, these signals are distorted and spread over sequential symbols and result in inter symbol interferences (ISI) and bit errors at the receiving end of the second electronic device 104. These ISI and bit errors can be suppressed by a finite impulse response (FIR) filter 340 (FIG. 3) that is coupled serially on a path of the data link 106 and configured with equalization settings using an equalization procedure. The equalization procedure is implemented when a high speed data transfer rate needs to be initialized, when an equalization request is issued from the application layer 208, or when a bit error rate (BER) exceeds a data error tolerance. In some implementations, initiation and termination of the equalization procedure are detected on the physical layer 214 based on data packets transferred over the data link 106.

Figure 3:
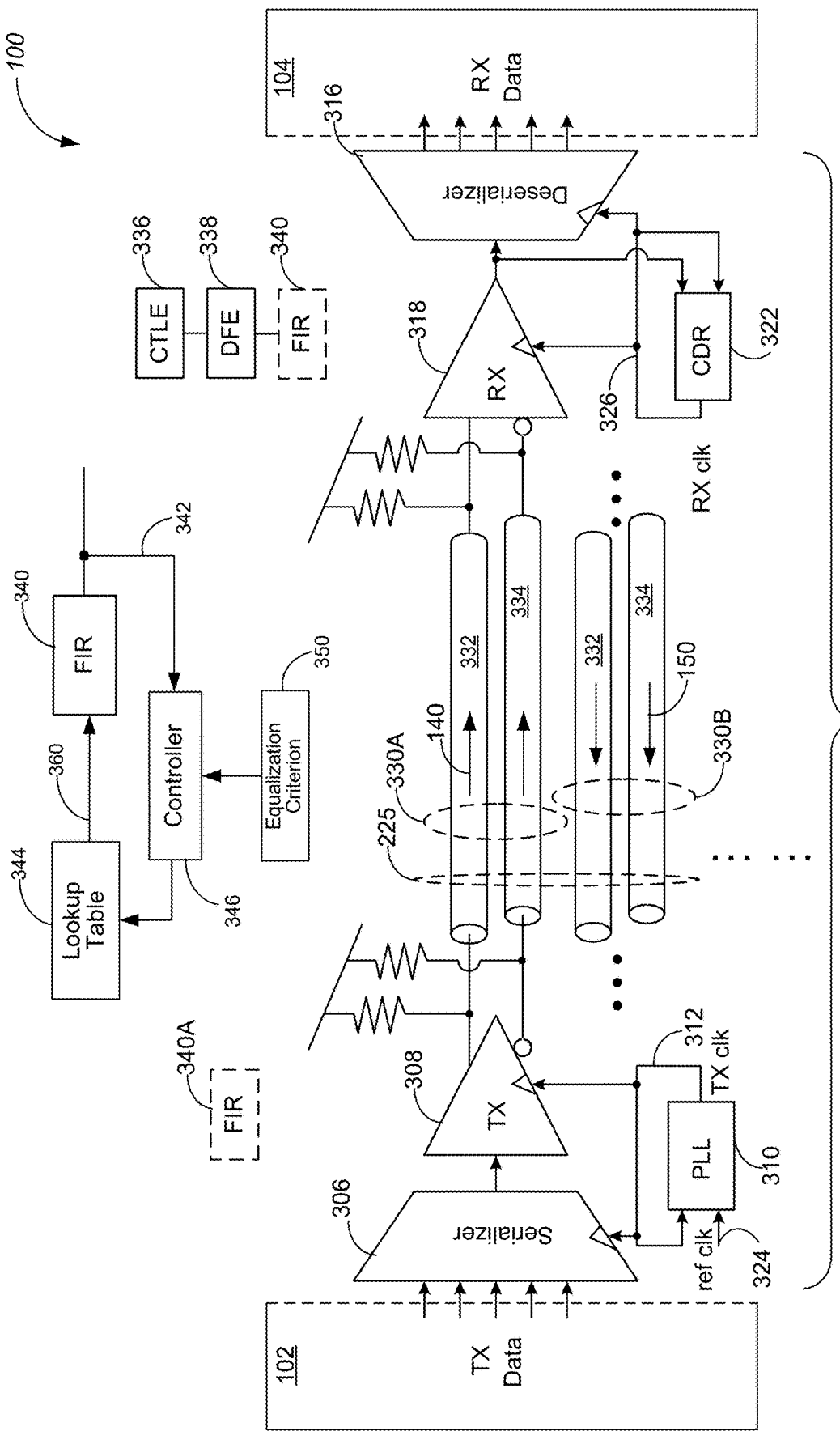
FIG. 3 is a block diagram an example electronic system in which a first electronic device or component is electrically coupled to a second electronic device or component via a data link, in accordance with some embodiments.

FIG. 3 is a block diagram of another example electronic system 100 in which a first electronic device or component 102 is electrically coupled to a second electronic device or component 104 via a data link 106, in accordance with some implementations. In an example, the first electronic device 102 includes a central processing unit (CPU) of a personal computer, and the second electronic device 104 is a peripheral component of the personal computer, such as a graphics card, a hard drive, a solid state drive, a Wi-Fi communication module, or an Ethernet card. The data link 106 includes a connection port for receiving data from the second electronic device 104. The connection port is optionally formed on a mother board of the personal computer. In some implementations, the data link 106 complies with a high-speed serial computer expansion bus standard (e.g., PCI Express (PCIe), USB 4) and provides an interface to communicate data packets between the first and second electronic devices 102 and 104 in compliance with the bus standard. The data link 106 is a serial data bus including one or more data channels 225. In some embodiments, each data channel 225 includes two wire sets 330A and 330B (also called two data lanes) for transmitting and receiving data packets, respectively, thereby supporting full-duplex communication between the first and second electronic devices 102 and 104. In some examples, the data link 106 has 1, 4, 8, or 16 channels coupled in a single data port of the data link 106. For each data channel 225, the two wire sets 330A and 330B correspond to a downstream data direction 140 and an upstream data direction 150 defined with respect to the first electronic device 102, respectively. Optionally, each wire set 330A or 330B includes two respective wires 332 and 334 for carrying a pair of differential signals.

In some implementations, the first electronic device 102 includes or is coupled to a root complex device (not shown) that is further coupled to the data link 106. The root complex device is configured to generate requests for transactions including a series of one or more packet transmissions on behalf of the first electronic device 102. Examples of the transactions include, but are not limited to, Memory Read, Memory Read Lock, Input Output (IO) Read, IO Write, Configuration Read, Configuration Write, and Message. In some implementations, the first electronic device 102 is coupled to one or more additional electronic devices besides the second electronic device 104. The data link 106 includes one or more switch devices to couple the root complex device of the first electronic device 102 to multiple end-points including the second electronic device 104 and additional electronic devices not shown in FIGS. 1 and 2.

A data transmission protocol (e.g., PCI Express, USB4 v2.0, DisplayPort 2.1) is established based on a layered model including an application layer 208, a transaction layer 210, a data link layer 212, and a physical layer 214. As the top layer, the application layer 208 is implemented in software programs, such as Ethernet, NVMe, SOP, AHCI, and SATA. In the transaction layer 210, each transaction of a series of packet transmissions is implemented as requests and responses separated by time. For example, a memory-related transaction is translated to device configuration and control data transferred to or from the second electronic device 104 (e.g., a memory device). Data packets associated with each transaction are managed by data flows on the data link layer 212. The physical layer 214 controls link training and electrical (analog) signaling, and includes a logical block and an electrical block. The logic block 216 defines ordered data sets in training states, and the electrical block 218 defines eye diagram characteristics and analog waveforms. Each layer of the layered model includes first specifications for a transmitting side where a root complex device is coupled and second specifications for a receiving side where a peripheral component (i.e., the second electronic device 104) is coupled.

As signals are transmitted within the wire sets 330 of each data channel 225 of the data link 106, the signals are distorted and spread over sequential symbols and result in inter symbol interferences (ISI) and bit errors at the receiving side of the second electronic device 104. In some implementations, these ISI and bit errors can be suppressed by a finite impulse response (FIR) filter 340 that is coupled serially on a path of the data link 106 and configured with equalization settings using an equalization procedure. For example, an equalization procedure is implemented when a high speed data transfer rate needs to be initialized, when an equalization request is issued from the application layer, or when a BER exceeds a data error tolerance.

The electronic system 100 includes a serializer and deserializer (SERDES) system corresponding to the data link 106. The SERDES system of the data link 106 includes a serializer 306, a transmitter 308, the data channel 225, a receiver 318, and a deserializer 316. The serializer 306 converts parallel data received from the first electronic device 102 to serial data. The transmitter 308 sends the serial data to the data channel 225. The receiver 318 processes the serial data and send the processed serial data to the deserializer 316, which converts the serial data back to the parallel data for the second electronic device 104. On a transmitting side, a phase lock loop 310 generates a transmitter clock signal 312 based on a reference clock 324, and the transmitter clock signal 312 is applied to control serialization of the data to be transmitted by the data channel 225 of the data link 106.

On a receiving side, a clock data recovery (CDR) circuit 322 is used to recover a receiver clock signal 326 from the serial data received via the data channel 225 and compensate for a variation of signal amplitudes caused by a loss and other factors in this data channel 225. The receiver clock signal 326 is used with the receiver 318 and deserializer 316 to condition the serial data received via the data channel 106 and regenerate the parallel data from the serial data. During this process, the receiver 318 is configured to reduce signal distortion, data spreading over sequential symbols, inter symbol interferences, and resulting bit errors of the serial data on the receiving side of the second electronic device 104. Specifically, in some embodiments, the receiver 318 includes a continuous time linear equalizer (CTLE) 336, a decision feedback equalizer (DFE) 338, and an FIR filter 340. The CTLE 336 is configured to selectively attenuate low frequency signal components, amplify signal components around the Nyquist frequency, and remove higher frequency signal components to generate filtered serial data. The DFE 338 is configured to further amplify the filtered serial data, and recover one or more data bits at each clock switching edge or during each clock cycle. The one or more recovered data bits form data packets. The FIR filter 340 has a plurality of equalization settings (e.g., FIR coefficients), and is applied to improve signal quality of the data packets via digital signal conditioning (e.g., via high frequency filtering in a digital domain).

This application is directed to adaptively setting feedforward equalization (FFE) for a data communication channel. Specifically, the FIR filter 340 has a plurality of FIR coefficients configured to be defined by one of a plurality of preset configurations, and generates an equalization signal 342. The electronic system 100 obtains a lookup table 344 having a plurality of rows. Each row is associated with a different preset configuration of the FIR coefficients and identifies a subset of respective preset configurations corresponding to a subset of FIR coefficients. The lookup table 344 is stored in a memory of the electronic system 100. Dynamically and in real time, while the FIR filter 340 generates the equalization signal 342, the electronic system 100 (e.g., a controller 346) determines a plurality of residual errors corresponding to a plurality of signal samples of the equalization signal 342 and selects a temporal sequence 360 of preset configurations of the FIR coefficients from the lookup table 344 based on the plurality of residual errors, until a predefined equalization criterion 350 is satisfied. In some embodiments, the FIR filter 340A is included in the transmitter 308, and the equalization signal 342 is transmitted over the data channel 225 and collected at an input of the receiver 318. Alternatively, in some embodiments, the FIR filter 340B is included in the receiver 318, and the equalization signal 342 is collected at an output of the FIR filter 340B in the receiver 318. In some embodiments, the temporal sequence 360 of preset configurations includes a first total number of different preset configurations, and the first total number is less than a second total number of preset configurations in the plurality of preset configurations. By these means, the electronic system 100 does not scan through all of the plurality of preset configurations and can identify a target preset configuration quickly via the temporal sequence 360 of preset configurations.

Figure 4A:
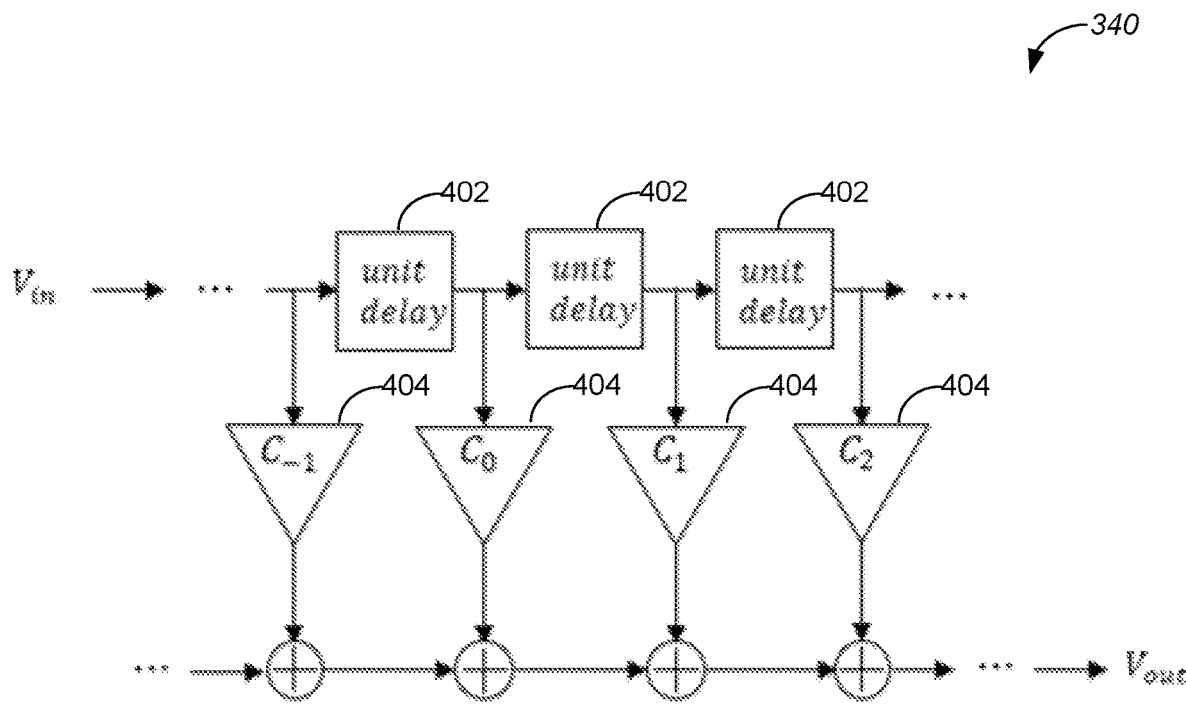
FIG. 4A is a schematic diagram of a finite impulse response (FIR) filter of a retimer, in accordance with some embodiments.
Figure 4C:
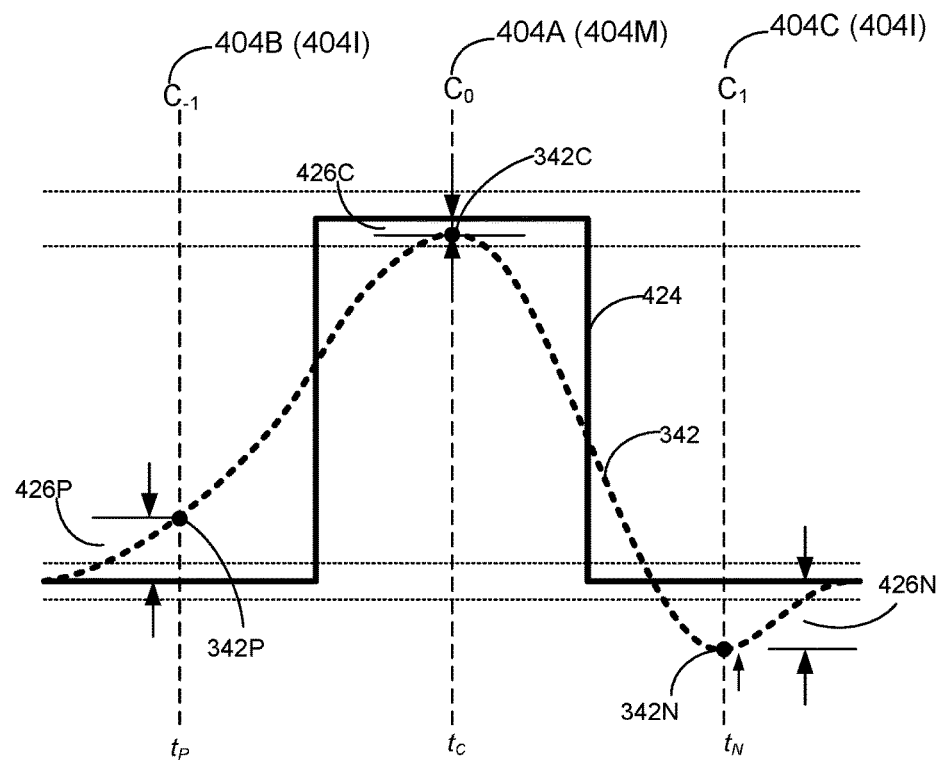
FIG. 4C is a temporal diagram of an equalization signal that is modified according to a target electrical signal using FIR coefficients, in accordance with some embodiments.

FIG. 4A is a schematic diagram of a finite impulse response (FIR) filter 340 of a retimer 220, in accordance with some embodiments, and FIG. 4B is an example FFE preset table 400 including a plurality of preset configurations 410 of FIR coefficients (e.g., $C_{+1}$, $C_0$, $C_{-1}$) in compliance with a data transmission standard (e.g., DisplayPort 2.1), in accordance with some embodiments. FIG. 4C is a temporal diagram 420 of an equalization signal 342 that is modified according to a target electrical signal 422 using FIR coefficients, in accordance with some embodiments. In high speed digital communication, FFE is a commonly used filtering technique for compensating insertion loss in a data communication channel. The FFE is implemented by a transversal filter (e.g., an FIR filter 340) that generates a finite impulse response. The FIR filter 340 improves signal quality by reducing intersymbol interference (ISI), a major source of data-dependent noise. It is commonly implemented using a set of unit delay cells 402 and weighted segments associated with each delay tap 404 (e.g., $C_{-2}$, $C_{-1}$, $C_0$, and $C_{+1}$). The delay tap 404 ($C_{-1}$) has a negative index and is also called a precursor ISI tap. The delay tap 404 ($C_0$) is also called a main tap 404M. A delay tap 404 ($C_{+1}$) has a positive index and is called a postcursor ISI tap. The delay taps 404 that are distinct from $C_0$ are collectively called ISI taps 404I. Some communication protocols such as DisplayPort 2.1 and USB4 2.0 mandate implementation of FFE at a physical layer 214 (FIG. 2). Specifications define a list of possible FFE configurations using the FFE preset table 400, which outlines a number of combinations of coefficient weights/values for the delay taps 404 (e.g., $C_{+1}$, $C_0$, and $C_{-1}$). For example, referring to FIG. 4B, the DisplayPort 2.1 standard is set by Video Electronics Standards Association (VESA), and includes a total of three filter taps ($C_{-1}$, $C_0$, and $C_{+1}$) and 16 preset configurations 410. Similar preset tables are used for other data communication protocols (e.g., USB, thunderbolt), and this invention is not bound to, and can be configurated to be applied in, any particular data communication protocol.

Specifically, the FIR filter 340 is configured to equalize electrical signals carrying data packets to mitigate inter symbol interference and improve a BER, e.g., suppress the BER below a data error tolerance. In some embodiments, the FIR filter 340 has a frequency response equal to inverse of a frequency response of part of the data link 106. For example, the electrical signals are amplified with a gain at a high frequency range to counteract high-frequency signal attenuation. The FIR filter 340 includes a plurality of FIR coefficients that are determined during an equalization procedure to compensate the signal attenuation adaptively. In some embodiments, an FIR filter 340A (FIG. 3) is included in the transmitter 308, and generates an equalization signal 342 that is transmitted over the data channel 225 and collected at an input of the receiver 318. Alternatively, in some embodiments, an FIR filter 340B (FIG. 3) is included in the receiver 318, and generates an equalization signal 342 that is collected at an output of the FIR filter 340B in the receiver 318.

In some embodiments, the FIR filter 340 includes three FIR coefficients 404 (e.g., $C_{+1}$, $C_0$, and $C_{-1}$) configured to combine three electrical signals $V_{n+1}$, $V_n$, and $V_{n-1}$ as follows:

$$V_N = C_{-1}V_{n-1} + C_0 V_n + C_{+1} V_{n+1}.$$

Each of the electrical signals $V_{n+1}$ and $V_{n-1}$ is shifted from $V_n$ by a clock period. A first FIR coefficient 404A ($C_0$) is greater than 0, and each of a second FIR coefficient 404B ($C_{-1}$) and a third FIR coefficient 404C ($C_{+1}$) is equal to or less than 0. Values of the FIR coefficients 404 ($C_{+1}$, $C_0$, and $C_{-1}$) are subject to one or more constraints defined in an electronic device bus standard, e.g., DisplayPort. In some embodiments, a default preset 410 of coefficient values is stored in a register for the FIR coefficients 404 ($C_{+1}$, $C_0$, and $C_{-1}$), and used prior to any equalization procedure. In some embodiments, a plurality of presets 410 of coefficient values is stored in the register, and one of plurality of presets 410 is selected to define the FIR coefficients 404 ($C_{+1}$, $C_0$, and $C_{-1}$) during the equalization procedure. In some embodiments, a set of coefficient values is determined and applied during the equalization procedure. The set of coefficient values of the FIR coefficients 404 ($C_{+1}$, $C_0$, and $C_{-1}$) is distinct from the default set or any of the plurality of presets 410, and is determined as a result of protocol-aware equalization negotiation. In some embodiments, these coefficient values of the FIR coefficients 404 ($C_{+1}$, $C_0$, and $C_{-1}$) are communicated to the FIR filter 340 in TS1/TS2 symbols in an LTSSM state (e.g., a Recovery state in FIG. 16).

Alternatively, in some embodiments, the FIR filter 340 includes four FIR coefficients 404 ($C_{+1}$, $C_0$, and $C_{-1}$, and $C_{-2}$) configured to combine four electrical signals $V_{n+1}$, $V_n$, $V_{n-1}$, and $V_{n-2}$ as follows:

$$V_N = C_{-2}V_{n-2} + C_{-1}V_{n-1} + C_0V_n + C_{+1}V_{n+1}.$$

The electrical signal $V_{n-2}$ is shifted from $V_n$ by two clock periods, and each of the electrical signals $V_{n+1}$ and $V_{n-1}$ is shifted from $V_n$ by a clock period. A first FIR coefficient $C_0$ is greater than 0, and each of a second FIR coefficient $C_{-1}$ and a third FIR coefficient $C_{+1}$ is equal to or less than 0. A fourth FIR coefficient $C_{-2}$ is equal to or greater than 0. Values of the FIR coefficients 404 ($C_{+1}$, $C_0$, and $C_{-1}$, and $C_{-2}$) are subject to one or more constraints defined in an electronic device bus standard, e.g., USB4. In some embodiments, a default preset of coefficient values is stored in a register for the FIR coefficients $C_{+1}$, $C_0$, $C_{-1}$, and $C_{-2}$, and used prior to any equalization procedure. In some embodiments, a plurality of presets 410 of coefficient values (FIG. 11A) is stored in the register, and one of plurality of presets 410 is selected to define the FIR coefficients 404 ($C_{+1}$, $C_0$, and $C_{-1}$, and $C_{-2}$) during the equalization procedure. In some embodiments, a preset 410 of coefficient values is determined and applied during the equalization procedure. The preset 410 of coefficient values of the FIR coefficients 404 ($C_{+1}$, $C_0$, and $C_{-1}$, and $C_{-2}$) is distinct from the default set or any of the plurality of presets 410, and is determined as a result of protocol-aware equalization negotiation. In some embodiments, these coefficient values of the FIR coefficients 404 ($C_{+1}$, $C_0$, and $C_{-1}$, and $C_{-2}$) are communicated to the FIR filter 340 in TS1/TS2 symbols in a LTSSM state (e.g., a Recovery state in FIG. 12).

Referring to FIG. 4C, the target electrical signal 422 alternates between a high voltage representing "1" and a low voltage representing "0" according to a clock frequency. Each rising or fall edge of the target electrical signal 422 has a substantially sharp edge corresponding to a slew rate that is greater than a threshold rate. In some situations, the target electrical signal 422 transmitted in the data link 106 is degraded to generate the equalization signal 342 because of inter symbol interference, and the rising and fall edges of the target electrical signal 342 may be compromised to introduce a BER that is beyond an error tolerance. In some embodiments, the equalization signal 342 is generated at an output of the FIR filter 340, and the FIR coefficients 404 ($C_{+1}$, $C_0$, and $C_{-1}$, and $C_{-2}$) are modified to improve the equalization signal 342 with reference to the target electrical signal 424. In some embodiments, each FIR coefficient 404 is individually adjusted to improve the equalization signal 342. Alternatively, in some embodiments, two or more FIR coefficients 404 are adjusted jointly to improve the equalization signal 342.

Specifically, the electrical signal 342 is sampled according to a data sampling rate. The first FIR coefficient 404A ($C_0$) corresponds to a current signal sample 342C of the electrical signal 342 sampled at a current time $t_C$. The second FIR coefficient 404B ($C_{-1}$) is applied to modify a prior signal sample 342P of the electrical signal 342 corresponding to a prior time tp. The third FIR coefficient 404C ($C_{+1}$) is applied to modify a next signal sample 342N of the electrical signal 342 corresponding to a next time $t_N$. The second FIR coefficient 404B ($C_{-1}$) is adjusted (e.g., increased or reduced) to reduce a residual error 426P detected between the prior signal sample 342P of the equalization signal 342 and a corresponding sample of the target electrical signal 424. The third FIR coefficient 404C ($C_{+1}$) is adjusted (e.g., increased or reduced) to reduce a residual error 426N detected between the next signal sample 342N of the equalization signal 342 and a corresponding sample of the target electrical signal 424, respectively. More specifically, in accordance with a determination that the residual error 426P or 426N is greater than 0 (i.e., that the signal sample 342P or 342N is greater than a corresponding sample of the target electrical signal 424), the corresponding FIR coefficient 404B or 404C is decreases (e.g., becomes more negative). In accordance with a determination that the residual error 426P or 426N is less than 0 (i.e., that the signal sample 342P or 342N is less than a corresponding sample of the target electrical signal 424), the corresponding FIR coefficient 404B or 404C is increased (e.g., becomes less negative). Referring to FIG. 4C, in an example, the second FIR coefficient 404B ($C_{-1}$) is reduced, and the third FIR coefficient 404C ($C_{+1}$) is increased to reduce the residual errors associated with the signal samples of the electrical signal 342.

In some embodiments, residual errors 426 are determined for a plurality of signal samples 342C, 342P, and 342N of the equalization signal 342. Based on the residual errors 426, the electronic system 100 determines directions to the second FIR coefficient 404B ($C_{-1}$) and the third FIR coefficient 404C ($C_{+1}$), and selects one or more preset configurations 410 of the FIR coefficients 404 successively based on the determined directions. The one or more selected preset configurations 410 are applied successively in place of a current preset configuration 410 that is currently applied by the FIR filter 340. The current and selected preset configurations 410 does not follow an order of the preset configurations 410 in the FFE preset table 400. Optionally, at least two immediately successive preset configurations of the sequence 360 of preset configurations 410 are not immediately adjacent in the FFE preset table 400. Optionally, at least two immediately successive preset configurations 410 of the sequence 360 of preset configurations 410 has an opposite order to those preset configurations 410 in the FFE preset table 400. By these means, the residual errors 426 determined for the signal samples of the equalization signal 342 are applied to identify a target preset configuration 410 in the FFE preset table 400 promptly without determining precise improvements on the residual errors 426 associated with each individual preset configuration 410 in the FFE preset table 400 successively.

Figure 5:
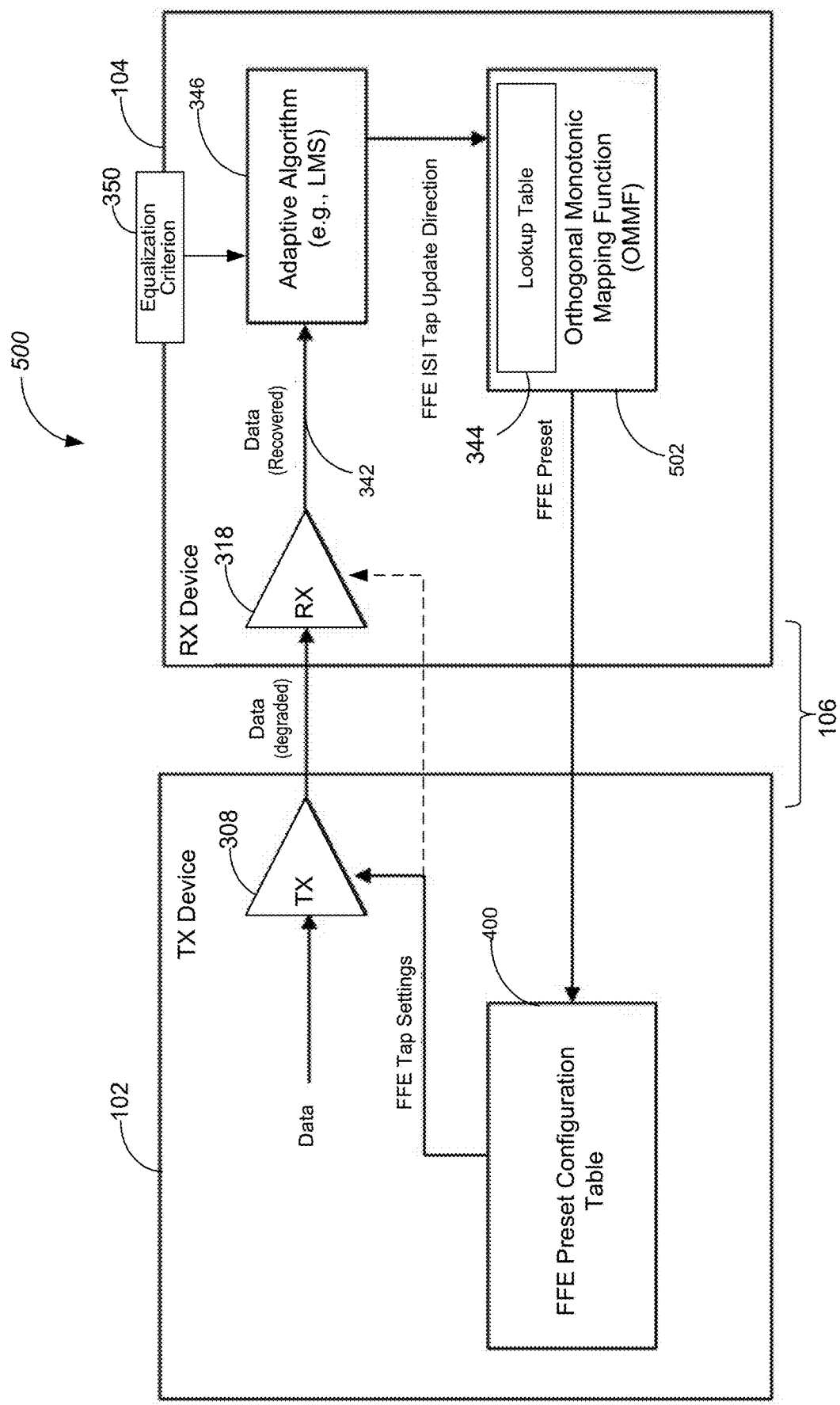
FIG. 5 is a block diagram of an FFE control loop in an electronic system, in accordance with some embodiments.

FIG. 5 is a block diagram of an FFE control loop 500 in an electronic system 100, in accordance with some embodiments. The electronic system 100 includes a first electronic device 102 and a second electronic device 104 coupled to the first electronic device via a data link 106. The first electronic device 102 includes a transmitter 308, and the second electronic device 102 includes a receiver 318. In some embodiments, the FIR filter 340A (FIG. 3) is included in the transmitter 308, and generates an equalization signal 342 that is transmitted over the data link 106 and collected at an input of the receiver 318. Alternatively, in some embodiments, an FIR filter 340B (FIG. 3) is included in the receiver 318, and generates an equalization signal 342 that is collected at an output of the FIR filter 340B in the receiver 318. The FFE control loop 500 includes a controller 346 configured to adaptively set FFE for the FIR filter 340. The controller 346 determines a plurality of residual errors 426 (FIG. 4C) corresponding to a plurality of signal samples of an equalization signal 342 including input data and controls an orthogonal monotonic mapping function (OMMF) module 502 to select a temporal sequence 360 of preset configurations 410 of the FIR coefficients 404 from a lookup table 344 based on the plurality of residual errors 426, until a predefined equalization criterion 350 is satisfied. Values of the FIR coefficients (e.g., $C_{+1}$, $C_0$, $C_{-1}$) of the selected preset configurations 410 are identified in an FFE preset table 400 that complies with a corresponding data transmission standard adopted by the electronic system 100.

The lookup table 344 (FIGS. 6 and 7) has a plurality of rows, wherein each row is associated with a different current preset configuration 410 of the FIR coefficients 404 and identifies a subset of respective next preset configurations corresponding to a subset of adjustable FIR coefficients 404. More details on the lookup table 344 are explained below with reference to FIG. 7.

In some embodiments, each preset configuration 410 of the temporal sequence 360 of preset configurations 410 corresponds to an iteration of the FIR coefficients 404 during FFE adaptation. The controller 346 determines whether each ISI tap 404I of a current preset configuration 410C (FIG. 7) should be changed. Should one of the ISI taps 404I be changed, the controller 346 determines an update direction and check the lookup table 344 to identify a next preset configuration 410N based on the update direction. For example, during a current iteration, the current preset configuration 410C is Preset 2 in the FFE preset table 400, and it is determined that the update direction is associated with the ISI tap 404I ($C_{-1}$) and represented as "a $C_{-1}$ down direction." In a column corresponding to "$C_{-1}$ down", the next preset configuration 410N (e.g., "preset_b2") is identified. The current or next preset configuration is represented by an identifier (e.g., "2", "preset_b2") in the lookup table 344. The values of the FIR coefficients (e.g., $C_{+1}$, $C_0$, $C_{-1}$) of the current and next preset configurations 410C and 410N are identified in and extracted from the FFE preset table 400 (FIG. 8). The values of the FIR coefficients (e.g., $C_{+1}$, $C_0$, $C_{-1}$) are then applied to the FIR filter 340 during each iteration. In some embodiments, the controller 346 applies a Stochastic gradient descent (SGD) based method (e.g., including a least-mean square (LMS) method) to iteratively generate the temporal sequence 360 of preset configurations 410.

Figure 6:
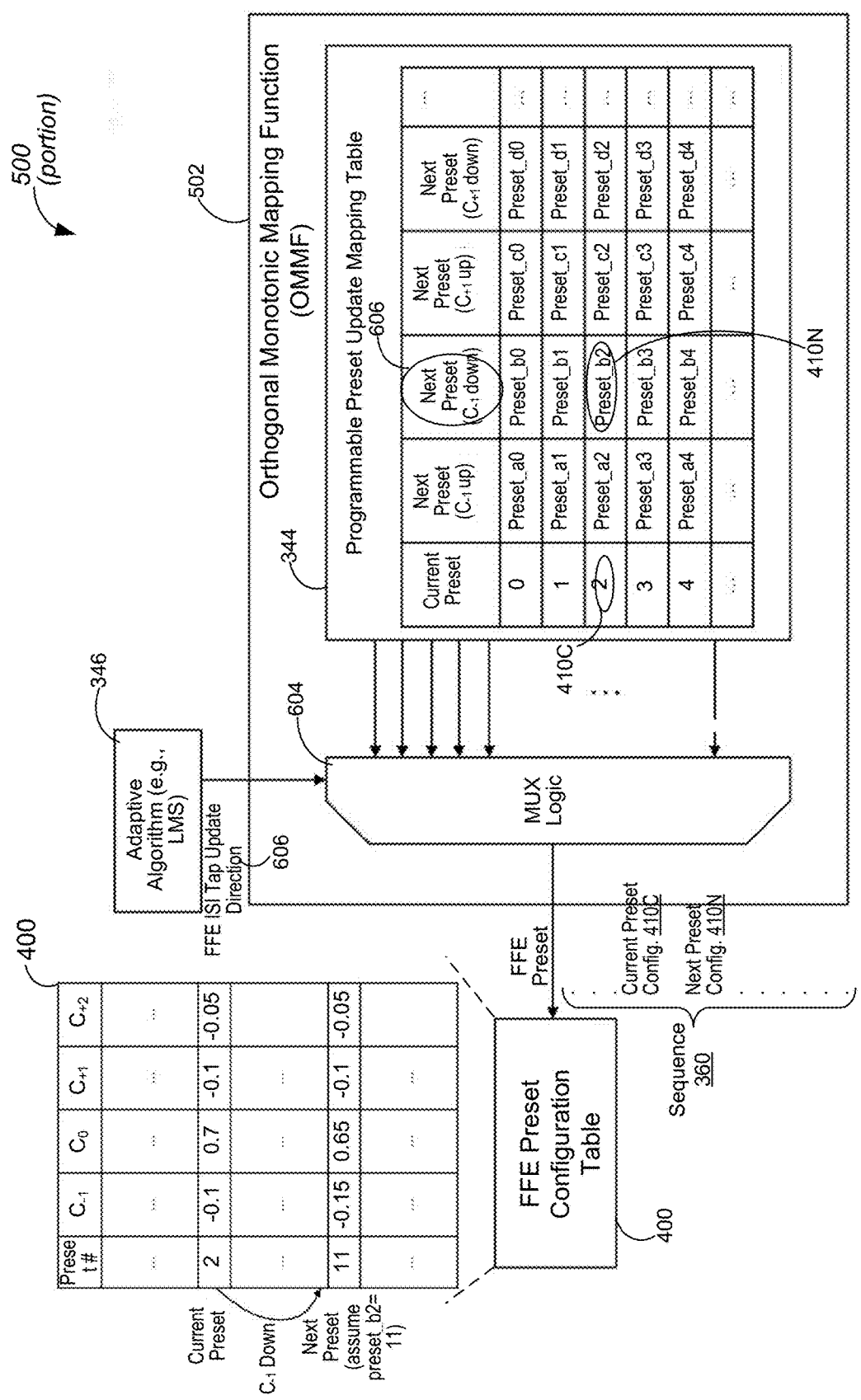
FIG. 6 is a block diagram of a portion of a FFE control loop configured to implement an orthogonal monotonic mapping function (OMMF) module in an electronic system, in accordance with some embodiments.

FIG. 6 is a block diagram of a portion of a FFE control loop 500 configured to implement an orthogonal monotonic mapping function (OMMF) module 502 in an electronic system 100, in accordance with some embodiments. The OMMF module 502 is implemented based on a lookup table 344 having a plurality of rows. Each row is associated with a different current preset configuration 410C of the FIR coefficients 404 and identifies a subset of respective next preset configurations 410CM corresponding to a subset of adjustable FIR coefficients 404. In an example, the lookup table 344 has N rows and 2M columns, and includes a matrix having a size of N×2M, where N is a total number of preset configurations (e.g., 16), and M is a total number of adjustable ISI taps 404I (e.g., $C_{-1}$ and $C_{+}$). More specifically, an example FFE preset table 400 only includes a first integer number (N) of preset configurations 410 of FIR coefficients (e.g., $C_{+1}$, $C_0$, $C_{-1}$) in compliance with a data transmission standard, and N preset configurations 410 correspond to N rows of the lookup table 344. The lookup table 344 has two adjustable FIR coefficients ($C_{+1}$ and $C_{-1}$). Each of the two adjustable FIR coefficients has two opposite update directions 606 (up and down), and therefore, each row of the lookup table 344 corresponds to four next preset configurations having four update directions 606 (e.g., $C_{+1}$ up, $C_{+1}$ down, $C_{-1}$ up and $C_{-1}$ down). Each of the four next preset configurations corresponds to a respective update direction 606 of a corresponding FIR coefficient 404 (e.g., $C_{+1}$ and $C_{-1}$) without affecting other FIR coefficients 404.

Based on the lookup table 344, the next preset configuration 410N is identified for the current preset configuration 410C to increase or decrease a particular adjustable ISI tap 404I without affecting other taps 404. In some embodiments, the OMMF module 502 includes a multiplexer logic 604 and the lookup table 344, which is a programmable mapping table. After the current preset configuration 410C is determined, the MUX logic 604 identifies the next preset configuration 410N at a cross section of a row corresponding to the current preset configuration 410C and a column corresponding to the identified update direction 606 of the adjustable ISI tap 410I. For example, the current preset configuration 410C is the second preset configuration (e.g., "2"). The controller 346 determines that the second FIR coefficient 404B ($C_{-1}$) needs to be reduced (e.g., which corresponds to an update direction 606 of "$C_{-1}$ down") based on residual errors 426. The OMMF module 502 further determines that the next preset configuration 410N (e.g., "preset_b2") in the lookup table 344 based on the update direction 606 of "$C_{-1}$ down". The second FIR coefficient 404B ($C_{-1}$) of the next preset configuration 410N (e.g., "preset_b2") is smaller than that of the current preset configuration 410C, while all other ISI taps 404I (which are distinct from the main tap 404M ($C_0$)) remain the same or vary slightly (e.g., within a tap variation tolerance) between the preset configurations 410N and 410C.

In an example, the current preset configuration 410C is Preset 2 in the FFE preset table 400 in FIG. 6. Given that "Preset_b2" is "11", the next preset configuration 410N is Preset 11 in the FFE preset table 400. The second FIR coefficient 404B ($C_{-1}$) decreases from −0.1 to −0.15, while the ISI taps 404I (i.e., FIR coefficients distinct from the main tap $C_0$) do not change. The main tap $C_0$ is optionally changed or not changed.

Figure 7:
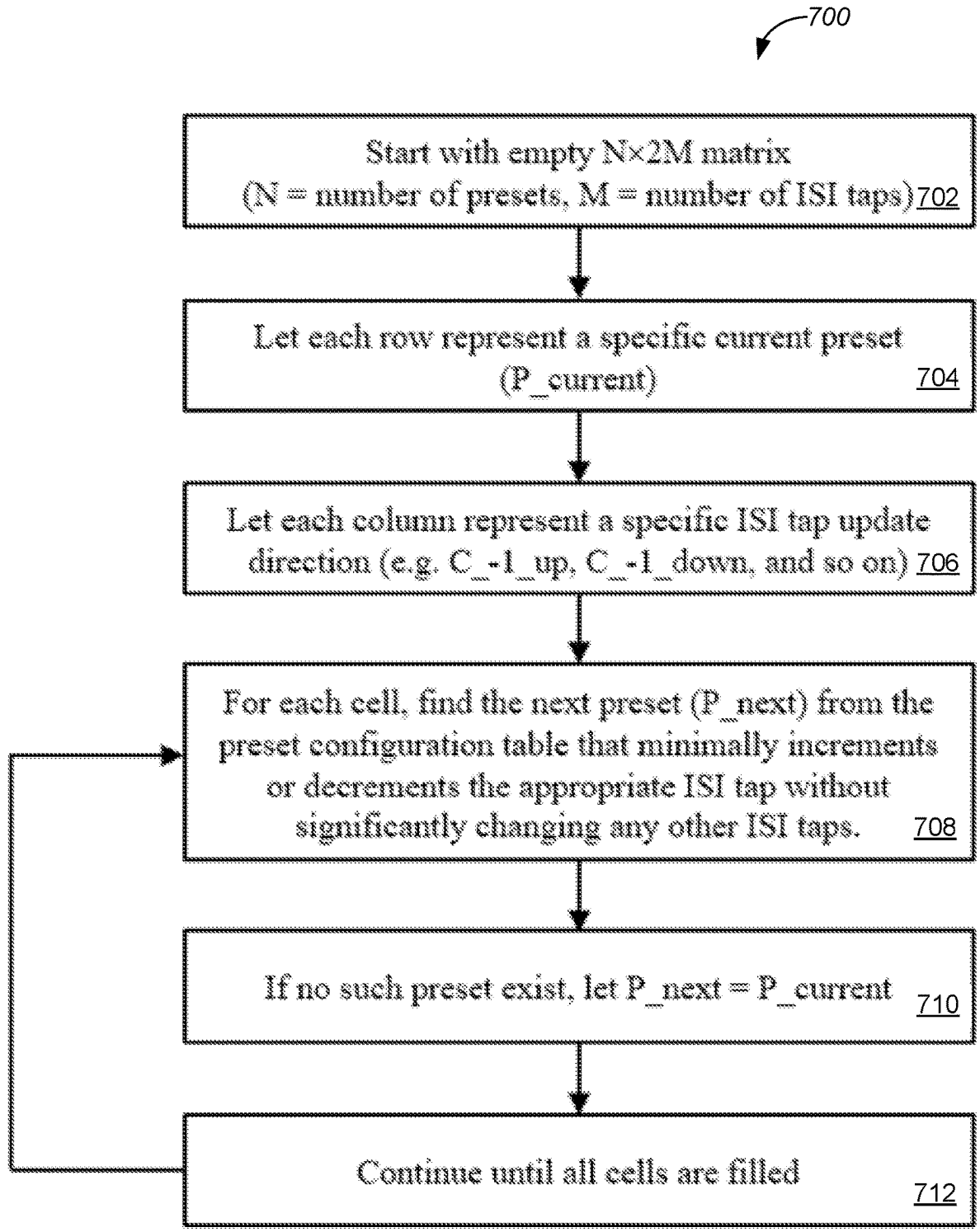
FIG. 7 is a flow chart of a process of generating a lookup table based on a FFE preset table that complies with a data communication standard applied to communicate data, in accordance with some embodiments.

FIG. 7 is a flow chart of a process 700 of generating a lookup table 344 based on a FFE preset table 400 that complies with a data communication standard applied to communicate data, in accordance with some embodiments. A matrix is defined (702) to have a size of N×2M, i.e., N rows and 2M columns, where N is a total number of current preset configuration 410C in the lookup table 344, and M is a total number of adjustable ISI tap 404I (e.g., a subset of FIR coefficients 404 that is distinct from the FIR coefficient $C_0$). In an example, the N rows of the lookup table 344 corresponds to all of the plurality of preset configurations 410 in the FFE preset table 400. Each row represents (704) and is associated with a different current preset configuration 410C of the FIR coefficients 404, and identifies, as candidates for a next preset configuration 410N, a subset of respective preset configurations 410 corresponding to a subset of adjustable FIR coefficients 404. The subset of respective preset configurations 410 corresponds to a plurality of columns of the lookup table 344, and represents a plurality of candidates for the next preset configuration 410N. Specifically, each column corresponds (706) to an update direction 606 associated with a respective adjustable FIR coefficient (e.g., an ISI tap 404I). For a current preset configuration 410C, the next preset configuration 410N is selected from the subset of respective preset configurations 410 of a respective row to adjust the respective ISI tap 404 according to the update direction 606 with no or little change to any other ISI taps 404I. In some embodiments, another ISI tap 404I is changed within a tap variation tolerance (e.g., within ±0.025), concurrently with the respective ISI tap 404.

For each row of the current preset configuration 410C, each column corresponds to an update direction 606 associated with a respective ISI tap 404I, and is filled with a candidate for the next preset configuration 410N based on a FFE preset table 400, until all columns are filled, i.e., until all update directions 606 are identified for all of the subset of adjustable ISI taps 404I. In an example, the current preset configuration 410C corresponds to Preset 6 in the FFE preset table 400 (FIG. 4B), and the update direction 606 is associated with a down direction of the second FIR coefficient 404B ($C_{-1}$). In some situations, the column corresponding to "$C_{-1}$ down" is filled by Preset 11. The second FIR coefficient 404B ($C_{-1}$) changes from −0.05 to −0.09, while the third FIR coefficient 404C ($C_{+1}$) remains identical. In another example, the current preset configuration 410C corresponds to Preset 7 in the FFE preset table 400. In some situations, the column of the lookup table 344 corresponding to "$C_{-1}$ down" is filled by Preset 12. The second FIR coefficient 404B ($C_{-1}$) changes from −0.05 to −0.09, and the third FIR coefficient 404C ($C_{+1}$) changes from −0.16 to −0.14 within the tap variation tolerance (e.g., within +0.025).

In some embodiments, the respective ISI tap 404 has reached a corner value allowed in the FFE preset table 400 at the update direction 606, and the next preset configuration 410N is set (710) the same as the current preset configuration 410C. For example, the current preset configuration 410C corresponds to Preset 14 in the FFE preset table 400 (FIG. 4B), and the update direction 606 is associated with a down direction of the second FIR coefficient 404B ($C_{-1}$). The second FIR coefficient 404B ($C_{-1}$) of Preset 14 has reached the corner value of −0.17, and the column corresponding to "$C_{-1}$ down" is filled by Preset 14, indicating the next preset configuration 410N remains Preset 14. By these means, the plurality of columns are filled for each row and the plurality of rows are filled for the matrix corresponding to the FFE preset table 400.

FIGS. 8A and 8B are an example FFE preset table 400 and an example lookup table 344 corresponding to a first data communication standard (e.g., DisplayPort 2.1), in accordance with some embodiments. The lookup table 344 is generated from the FFE preset table 400. The FFE preset table 400 includes a plurality of preset configurations 410 of FIR coefficients 404 (e.g., $C_{+1}$, $C_0$, $C_{-1}$) in compliance with the first data transmission standard. A first FIR coefficient 404A ($C_0$) is also called a main tap 404M, and a second FIR coefficient 404B ($C_{-1}$) and a third FIR coefficient 404C ($C_{+1}$) are two ISI taps 404I. The FFE preset table 400 has 16 preset configurations 410 (e.g., Presets 0-15) of FIR coefficients 404 (e.g., $C_{+1}$, $C_0$, $C_{-1}$). A subset of FIR coefficients applied to define the lookup table 344 includes two FIR coefficients $C_{-1}$ and $C_{+1}$. The lookup table 344 defines, for each preset configuration 410 of the FIR coefficients 404, four preset configurations 410 corresponding to four update directions 606 including an increase direction of $C_{-1}$, a decrease direction of C. 1, an increase direction of $C_{+1}$, and a decrease direction of $C_{+1}$. Stated another way, for each current preset configuration 410C, the lookup table 344 defines four next preset configurations 410N corresponding to the four update directions 606 including a $C_{-1}$ up direction 606A, a $C_{-1}$ down direction 606B, a $C_{+1}$ up direction 606C, and a $C_{+1}$ up direction 606D.

In some embodiments, the current preset configuration 410C corresponds to Preset 5 in the plurality of preset configurations 410 of the FFE preset table 400. Preset 5 corresponds to the FIR coefficients 404 ($C_{-1}$, $C_0$, $C_{-1}$), which are equal to −0.05, 0.95, and 0, respectively. In accordance with a determination that the update direction includes the $C_{-1}$ up direction 606A, the next preset configuration 410N is Preset 0, such that the second FIR coefficient 404B ($C_{-1}$) increases from −0.05 to 0 (a closest value greater than −0.05 for $C_{-1}$) while the third FIR coefficient 404C ($C_{+1}$) remain 0. In accordance with a determination that the update direction includes the $C_{-1}$ down direction 606B, the next preset configuration 410N is Preset 10, such that the second FIR coefficient 404B ($C_{-1}$) decreases from −0.05 to −0.09 (a closest value less than −0.05 for $C_{-1}$), while the third FIR coefficient 404C ($C_{+1}$) remains 0. In accordance with a determination that the update direction includes the $C_{+1}$ up direction 606C, the third FIR coefficient 404C ($C_{+1}$) already reaches a corner (e.g., a maximum value allowed by the plurality of the preset configurations 410 of the FFE preset table 400). The next preset configuration 410N stays with Preset 5. In accordance with a determination that the update direction includes the $C_{+1}$ down direction 606D, the next preset configuration 410N is Preset 6 (where Preset 15 is a special mode not involved in FFE adaptation), such that the third FIR coefficient 404C ($C_{+1}$) decreases from 0 to −0.09 (a closest value less than 0 for $C_{+1}$), while the second FIR coefficient 404B ($C_{-1}$) remains −0.05.

In some embodiments, referring to FIG. 8B, in accordance with a determination that the update direction includes both the $C_{-1}$ down direction 606B and the $C_{+1}$ up direction 606C (e.g., based on a temporal diagram 420 in FIG. 4C), the preset configuration 410 changes (802) from Preset 5 to Preset 10 in response to the $C_{-1}$ down direction 606B, and stays (804) with Preset 10 in response to the $C_{+1}$ up direction 606C.

In some embodiments, the current preset configuration 410C corresponds to Preset 7 in the plurality of preset configurations 410 of the FFE preset table 400. Preset 7 corresponds to the FIR coefficients 404 ($C_{-1}$, $C_0$, $C_{-1}$), which are equal to −0.05, 0.79, and −0.16, respectively. In accordance with a determination that the update direction includes the $C_{-1}$ up direction 606A, the next preset configuration 410N is Preset 2, such that the second FIR coefficient 404B ($C_{-1}$) increases from −0.05 to 0 (a closest value greater than −0.05 for $C_{-1}$), while the third FIR coefficient 404C ($C_{+1}$) slightly drops from −0.16 to −0.17 within the tap variation tolerance (e.g., within +0.025). The exact value of −0.16 is not available for the third FIR coefficient 404C ($C_{+1}$) while the second FIR coefficient 404B ($C_{-1}$) is equal to 0, and therefore, the closest value of −0.17 is selected for the third FIR coefficient 404C ($C_{+1}$). Additionally, in some embodiments, the tap variation tolerance is predefined. In some embodiments, as the first data communication standard is updated (e.g., from DisplayPort 2.1 to a higher version), the lookup table 344 is programmable based on an updated FFE preset table 400, and potential mapping errors are also updated.

In some embodiments, the update direction 606 is determined based on a temporal diagram 420 of an equalization signal 342 that is compared with a target electrical signal 422 carrying a stream of data bits (e.g., in FIG. 4C). While the electronic system 100 generates the equalization signal 342 using the FIR filter 340 operating with a first preset configuration 410 (e.g., Preset 5 in FIG. 8B), the equalization signal 342 is sampled to obtain a set of successive signal samples 342 including a prior signal sample 342P, a current signal sample 342C, and a next signal sample 342N. Based on the stream of data bits carried by the equalization signal 342, a first residual error 426 corresponding to a first signal sample 342 (e.g., 342P) of the prior signal sample 342P, the current signal sample 342C, and the next signal sample 342N. Based on the first residual error 426 (e.g., 426P), a controller 346 (FIG. 3) determines a first update direction of a first FIR coefficient of the two FIR coefficients $C_{-1}$ and $C_{+1}$, such as a $C_{-1}$ down direction 606B in FIG. 8B. The first FIR coefficient (e.g., $C_{-1}$) corresponds to the first signal sample (e.g., 342P). In accordance with the first update direction of the first FIR coefficient (e.g., a $C_{-1}$ down direction 606B), a second preset configuration (e.g., Preset 10) is selected (802) from a row associated with the first preset configuration (e.g., Preset 5) in the lookup table 344.

Further, in some embodiments, based on the stream of data bits, the controller 346 determines a second residual error 426 (e.g., 426N) corresponding to a second distinct signal sample (e.g., 342N) of the prior signal sample 342P, the current signal sample 342C, and the next signal sample 342N. The controller 346 applies the second preset configuration (e.g., Preset 10) to the FIR filter 340. While generating the equalization signal 342 using the FIR filter 340 operating with the second preset configuration, based on the second residual error 426 (e.g., 426N), the electronic system 100 determines a second update direction of a second distinct FIR coefficient of the two FIR coefficients $C_{-1}$ and $C_{+1}$, such as a $C_{+1}$ up direction 606C in FIG. 8B. The second distinct FIR coefficient corresponding to the second distinct signal sample. In accordance with the second update direction of the second distinct FIR coefficient (e.g., a $C_{+1}$ up direction 606C), the controller 346 selects (804) a third preset configuration (e.g., Preset 10) from the row associated with the second preset configuration (e.g., Preset 10) in the lookup table 344.

Alternatively, in some embodiments, the first and second signal samples correspond to samples 342N and 342P, respectively. A $C_{+1}$ up direction 606C is applied prior to a $C_{-1}$ down direction 606B. When the FIR filter 340 operates with Preset 5, the controller 346 selects Preset 5 in response to the $C_{+1}$ up direction 606C, and Preset 10 in response to the $C_{-1}$ down direction 606B, leading to the same preset configuration.

Figure 9A:
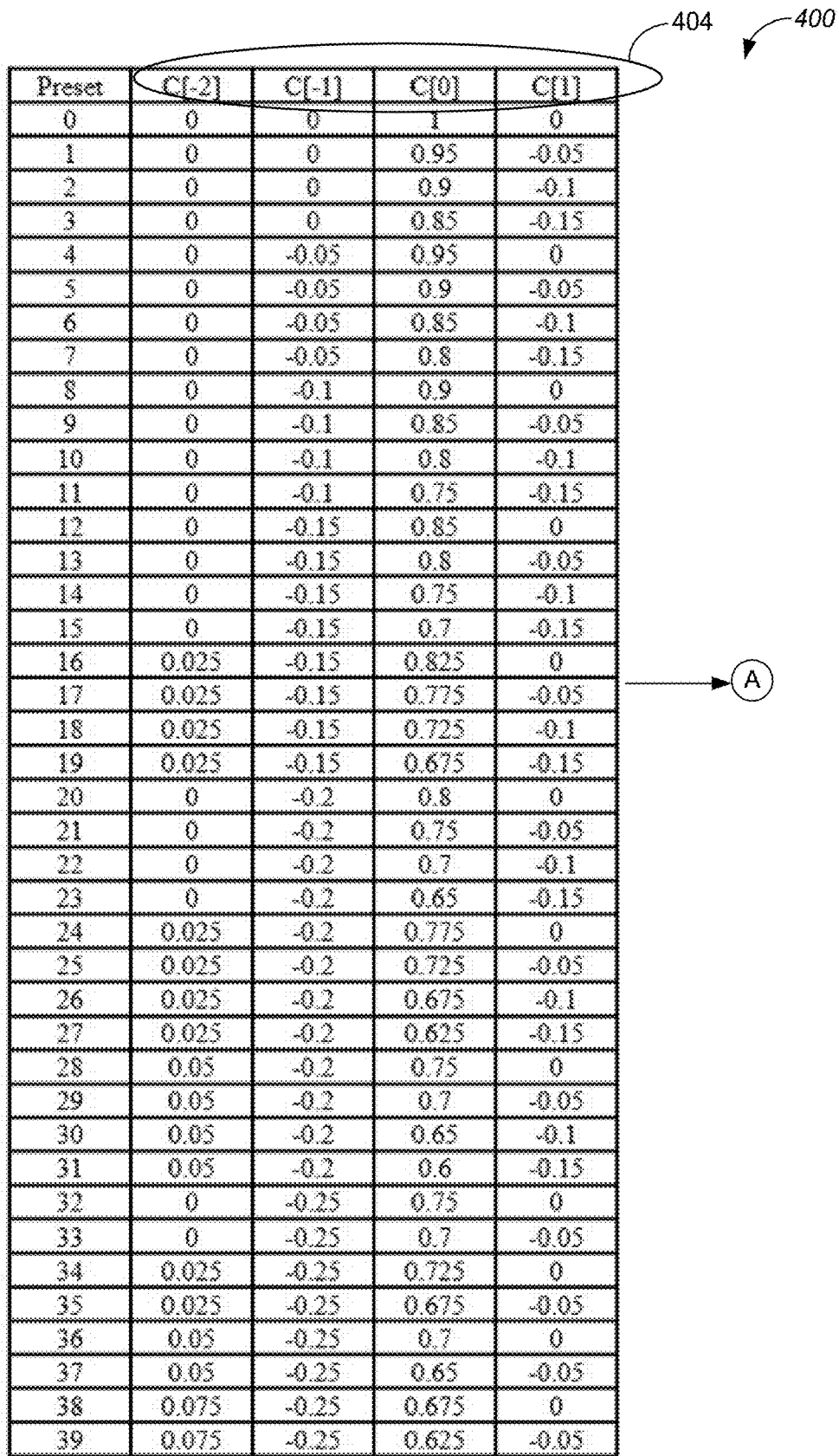

FIGS. 9A and 9B are another example FFE preset table 400 and another example lookup table 344 corresponding to a second data communication standard (e.g., USB4 v2.1), in accordance with some embodiments. The lookup table 344 is generated from the FFE preset table 400. The FFE preset table 400 includes a plurality of preset configurations 410 of FIR coefficients 404 (e.g., $C_{+1}$, $C_0$, $C_{-1}$, and $C_{-2}$) in compliance with the second data transmission standard. An FIR coefficient $C_0$ is also called a main tap, and the other FIR coefficients ($C_{+1}$, $C_{-1}$, and $C_{-2}$) are called three ISI taps 404I. The FFE preset table 400 has 40 preset configurations 410 (e.g., Presets 0-39) of FIR coefficients 404 (e.g., $C_{+1}$, $C_0$, $C_{-1}$, and $C_{-2}$). A subset of FIR coefficients applied to define the lookup table 344 includes three ISI taps 404I, i.e., three FIR coefficients $C_{-2}$, $C_{-1}$ and $C_{+1}$ distinct from $C_0$. The lookup table 344 defines, for each preset configuration 410 of the FIR coefficients 404, six preset configurations 410 corresponding to six update directions 606 including an increase direction of $C_{-2}$, a decrease direction of $C_{-2}$, an increase direction of $C_{-1}$, a decrease direction of $C_{-1}$, an increase direction of $C_{+1}$, and a decrease direction of $C_{+1}$. Stated another way, for each current preset configuration 410C, the lookup table 344 defines six next preset configurations 410N corresponding to the six update directions 606 including a $C_{-1}$ up direction 606A, a $C_{-1}$ down direction 606B, a $C_{+1}$ up direction 606C, a $C_{+1}$ up direction 606D, a $C_{-2}$ up direction 606E, a $C_{-2}$ down direction 606F.

Figure 10:
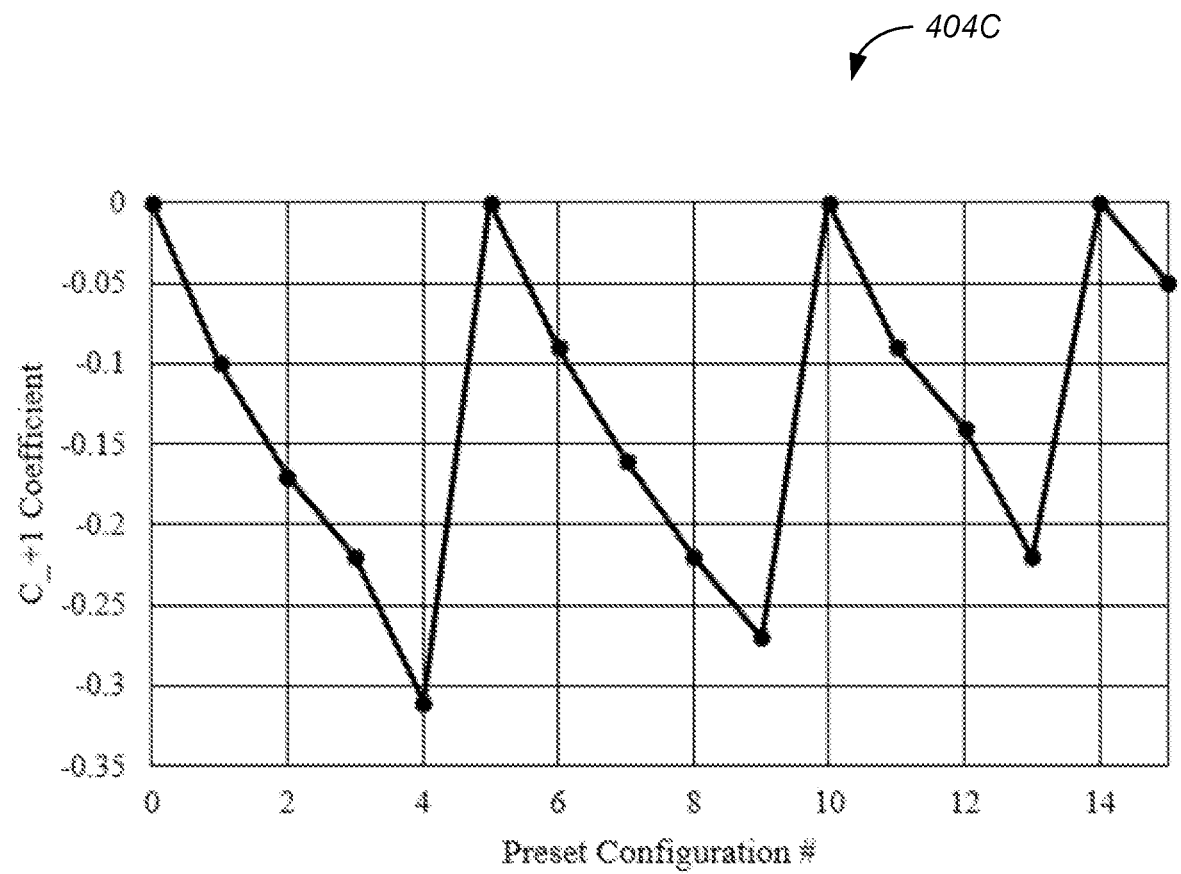
FIG. 10 is a line plot of an example FIR coefficient $C_{+1}$ in a plurality of preset configurations of an FFR preset table shown in FIG. 8A, in accordance with some embodiments.

FIG. 10 is a line plot of an example FIR coefficient (404C) $C_{+1}$ in a plurality of preset configurations 410 of an FFR preset table 400 shown in FIG. 8A, in accordance with some embodiments. The FIR coefficient (404C) $C_{+1}$ does not vary monotonically among the plurality of preset configurations 410. An electronic system 100 with FFEs employs adaptive FFR algorithms to find optimal preset configurations, in which the filter coefficients 404 are selected such that the FIR filter 340 cancels ISI for a data communication channel. In some situations, a choice of FFR algorithm is not prescribed or mandated in a corresponding data communication standard. In some embodiments, search is applied to cycle through every possible preset configuration 410 (e.g., Presets 0-15 in FIG. 8A) defined in the FFR preset table 400, and a target preset configuration is selected based on residual errors 426 (e.g., in accordance with a determination that the residual errors 426 are minimized or controlled below a threshold error). Alternatively, in some embodiments, a SGD based method is applied, and an example of the SGD based method is an LMS algorithm.

In some embodiments, the SGD based method is applied in accordance with a determination that the plurality of preset configurations 410 satisfies monotonicity and orthogonality requirements. In accordance with the SGD based method, the electronic system 100 determines the residual errors 426 of the signal samples 342 associated with ISI taps 404I (e.g., $C_{-1}$ and $C_{+1}$, but not $C_0$) at each iteration. In accordance with a determination that the residual error 426 is positive for a particular ISI tap 404I, such as $C_{+1}$, the electronic system 100 decreases a corresponding FIR coefficient $C_{+1}$ by 1 step (e.g., by making it more negative) to cancel more ISI. Conversely, in accordance with a determination that the residual error 426 is negative, the electronic system 100 increases a corresponding FIR coefficient $C_{+1}$ by 1 step (e.g., by making it less negative) to cancel less ISI. In some embodiments, the FIR coefficient $C_{+1}$ is determined in accordance with a determination that a mean squared value of the residual error 426 is minimized, e.g., when the SGD based method converges. As such, each ISI tap 404I is configured to be adjusted independently at two opposite directions with a minimal step allowed by the FFE preset table 400.

Referring to FIG. 10, in some embodiments, the FIR coefficient (404C) $C_{+1}$ does not vary monotonically among the plurality of preset configurations 410 of an FFR preset table 400 (FIG. 8A). The FFR preset table 400 is not directly applied to enable the SGD based method. Instead, in some embodiments, the lookup table 344 is generated based on the FFR preset table 400. The lookup table 344 has a plurality of rows. Each row is associated with a different current preset configuration of the FIR coefficients 404 (e.g., $C_{-1}$, $C_{+1}$, and $C_0$) and identifies a subset of respective next preset configurations 410N corresponding to a subset of adjustable FIR coefficients 404 (e.g., ISI taps 404I). For example, the ISI taps 404I includes two FIR coefficients $C_{-1}$ and $C_{+1}$, and there are four possible update directions 606 including a $C_{-1}$ up direction 606A, a $C_{-1}$ down direction 606B, a $C_{+1}$ up direction 606C, and a $C_{+1}$ up direction 606D. The lookup table 344 complies with the monotonicity and orthogonality requirements, and is applied to enable the SGD based method for selecting a temporal sequence 360 of preset configurations 410 of the FIR coefficients 404 until a predefined equalization criterion 350 is satisfied.

Figure 11:
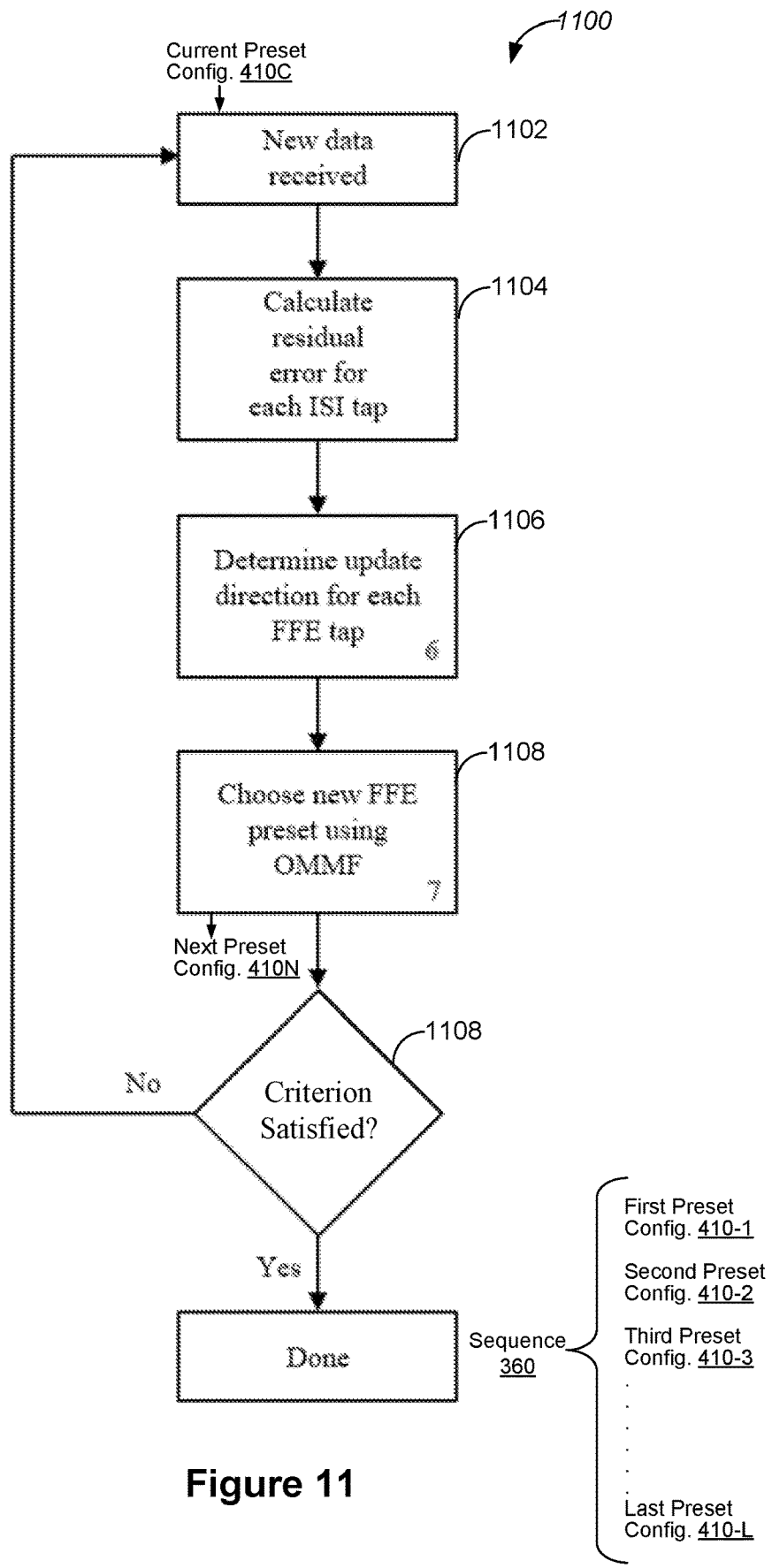
FIG. 11 is a flow diagram of a process for determining a temporal sequence of preset configurations of FIR coefficients for an FIR filter in an electronic system, in accordance with some embodiments.

FIG. 11 is a flow diagram of a process 1100 for determining a temporal sequence 360 of preset configurations 410 of FIR coefficients 404 for an FIR filter 340 in an electronic system 100, in accordance with some embodiments. Based on a lookup table 344, the electronic system 100 selects the temporal sequence 360 of preset configurations 410 of the FIR coefficients 404 from a lookup table 344 until a predefined equalization criterion 350 is satisfied. The lookup table 344 defines a plurality of next preset configurations 410N for the current preset configuration 410C based on a plurality of update directions 606 of a subset of adjustable FIR coefficients 404 (e.g., ISI taps 404I).

Specifically, a transmitter 308 of a first electronic device 102 sends (1102) an electrical signal carrying a stream of digital data bits to a receiver 318 of a second electronic device 104. In some embodiments, an FIR filter 340 is included in the transmitter 308 and generates an equalization signal 342, and the electronical signal includes the equalization signal 342. Alternatively, in some embodiments, the FIR filter 340 is included in the receiver 318 and generates an equalization signal 342 from the electrical signal. The equalization signal 342 includes ISI-induced noise that is partially or entirely compensated by the FIR filter 340. A controller 346 (FIG. 3) obtains the equalization signal 342 and determines (1104) a plurality of residual errors 426 (FIG. 4C) corresponding to a plurality of signal samples of the equalization signal 342. Specifically, the controller 346 determines a residual error 426 corresponding to each ISI tap 404I distinct from the main tap 404M. Based on the residual errors 426, the controller 346 further determines one or more corresponding update direction 606 of the ISI taps 404I. While the FIR filter 340 operates with a current FIR preset configuration 410C, a next preset configuration 410N is selected and applied (1108) based on the update direction 606 of one of the ISI taps 404I.

Figure 12:
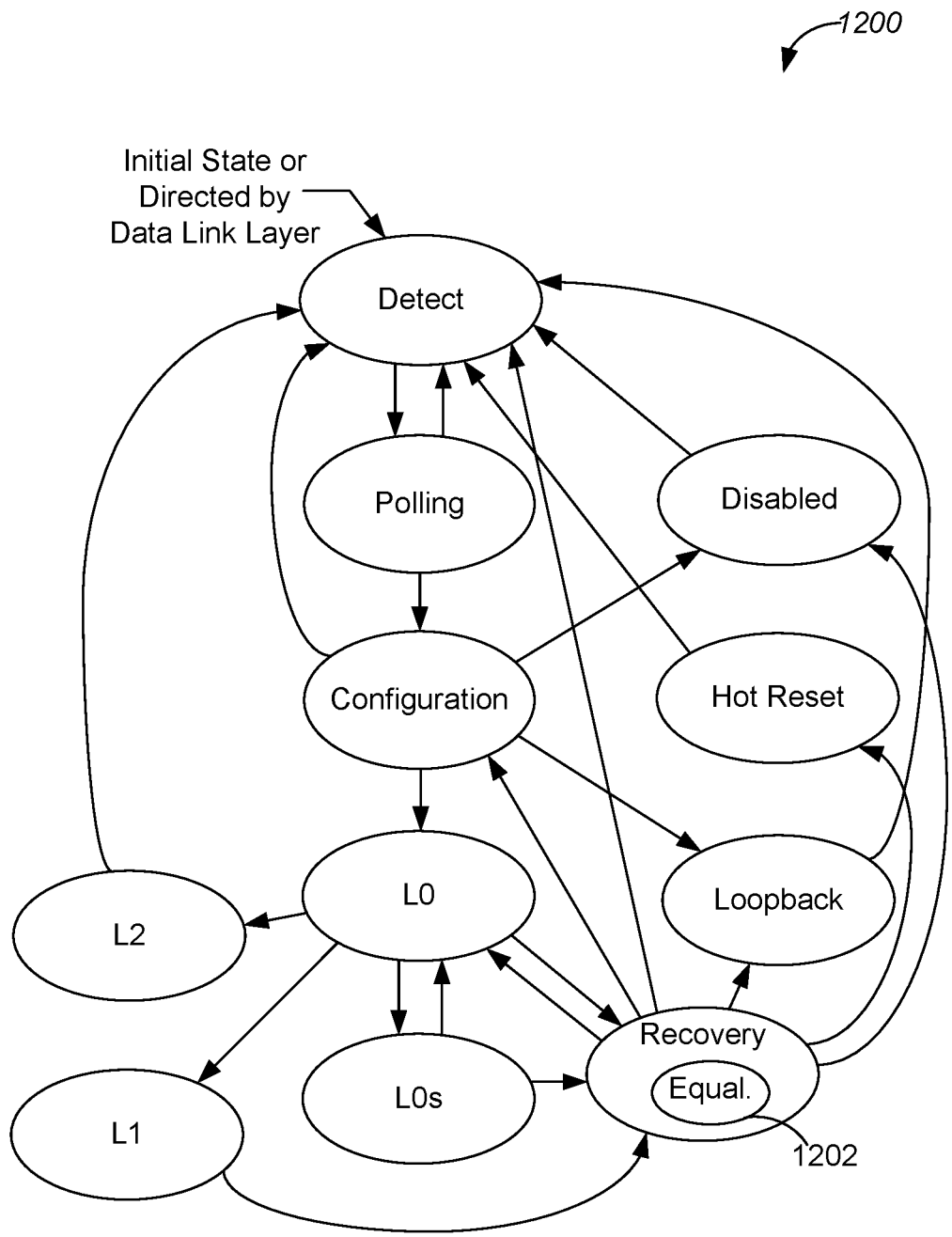
FIG. 12 is a state diagram of a Link Training and Status State Machine (LTSSM) of a data link, in accordance with some embodiments.

The controller 346 determines whether a predefined equalization criterion 350 is satisfied (1108). In accordance with a determination that the predefined equalization criterion 350 is not satisfied, the next preset configuration 410N is applied to the FIR filter 340, and operations 1102-1110 are repeated. Conversely, in accordance with a determination that the predefined equalization criterion 350 is satisfied, a last FIR preset configuration 410-L of the temporal sequence 360 of preset configurations 410 of the FIR coefficients 404 is applied to the FIR filter 340 for subsequent data transmission. A corresponding equalization procedure is completed. In some embodiments, the predefined equalization criterion 350 is satisfied in accordance with a determination that a predetermined duration of time has passed in response to an equalization instruction. In some embodiments, the predefined equalization criterion 350 is satisfied in accordance with a determination that a predefined first number (e.g., 2, 3, 4) of consecutive preset configurations 410 in the temporal sequence 360 includes the same preset configuration. In some embodiments, the predefined equalization criterion 350 is satisfied in accordance with a determination that a predefined second number (e.g., 4, 6, 8) of consecutive preset configurations 410 in the temporal sequence 360 varies between two distinct preset configurations. In some embodiments, the predefined equalization criterion 350 is satisfied in accordance with a determination that the temporal sequence 360 of preset configurations reaches a predefined third number (e.g., 10) of preset configurations. In some embodiments, the predefined equalization criterion 350 is satisfied in accordance with a determination that a subsequent system or data transmission instruction is received to terminate an equalization procedure 1202 (FIG. 12).

In some embodiments, an iteration of operations 1102-1108 generates a single preset configuration 410. After selecting each of the temporal sequence 360 of preset configurations of the FIR coefficients 404, sequentially, the controller 346 applies the respective preset configuration 410C to the FIR filter 340. A next preset configuration 410N follows the respective preset configuration and is determined based on the equalization signal 342 generated using the FIR filter 340 that operates with the respective preset configuration 410C.

In some embodiments, an iteration of operations 1102-1108 generates two or more preset configurations 410 that are sequentially applied, and the two or more preset configurations 410 in the temporal sequence 360 of preset configurations 410 of the FIR coefficients 404 are determined based on residual errors 426 of signal samples of the equalization signal 342 generated from the same preset configuration 410. Specifically, in some embodiments, while generating the equalization signal 342 using the FIR filter 340 operating with a first preset configuration 410-1, the electronic system 100 samples the equalization signal 342 to obtain a set of successive signal samples including one or more prior signal samples 342P, a current signal sample 342C, and one or more next signal samples 342N. Based on a stream of data bits carried by the equalization signal 342, a first residual error (e.g., 426P) is determined to corresponding to a first signal sample (e.g., 342P) of the one or more prior signal samples 342P and the one or more next signal samples 342N. Based on the first residual error (e.g., 426P), a first update direction 606 of a first FIR coefficient 404 (e.g., $C_{-1}$ (404B)) in the subset of FIR coefficients is determined, and the first FIR coefficient (e.g., $C_{-1}$ (404B)) corresponds to the first signal sample (e.g., 342P). In accordance with the first update direction 606 of the first FIR coefficient (e.g., $C_{-1}$ (404B)), the electronic system 100 selects a second preset configuration 410-2 from a row associated with the first preset configuration 410-1 in the lookup table 344.

Further, in some embodiments, based on the stream of data bits, the electronic system 100 determines a second residual error (e.g., 426N) corresponding to a second distinct signal sample (e.g., 342N) of the one or more prior signal samples 342P and the one or more next signal samples 342N. The second preset configuration 410-2 is applied to the plurality of FIR coefficients of the FIR filter 340. While generating the equalization signal 342 using the FIR filter operating with the second preset configuration 410-2, based on the second residual error, the electronic system 100 determines a second update direction of a second distinct FIR coefficient (e.g., $C_{+1}$ (404C)) in the subset of FIR coefficients. The second distinct FIR coefficient corresponds to the second distinct signal sample. In accordance with the second update direction 606 of the second distinct FIR coefficient 410-2, the electronic system selects a third preset configuration 410-3 from the row associated with the second preset configuration 410-2 in the lookup table 344. Alternatively, in some embodiments, the second and third preset configurations 410-2 and 410-3 correspond to the FIR coefficients $C_{+1}$ and $C_{-1}$, respectively. Alternatively, in some embodiments, three preset configurations are successively selected based on any ordered combination of the FIR coefficients $C_{+1}$, $C_{-1}$ and $C_{-2}$.

In some embodiments, the temporal sequence 360 of preset configurations includes a first total number of different preset configurations 410, and the first total number is less than a second total number of preset configurations 410 available in the plurality of preset configurations of the FFE preset table 400. By these means, the electronic system 100 does not scan through all of the plurality of preset configurations 410 and can identify a last preset configuration 420-L quickly via the temporal sequence 360 of preset configurations 410.

FIG. 12 is a state diagram of a Link Training and Status State Machine (LTSSM) 1200 of a data link 106, in accordance with some embodiments. The LTSSM 1200 has five categories of states: link training states (e.g., Detect, Polling, and Configuration), a link re-training state (e.g., Recovery), power management states (e.g., L0, L1, and L2), active power management states (e.g., L0s and L1), and other states (e.g., Disabled, Loopback, Hot Reset). Each state further includes one or more substrates. After any type of Reset exit or upon a request from a data link layer 212, the data link 106 goes through the Detect, Polling, and Configuration states sequentially and reaches the fully active state (L0) in which normal data transmission is implemented.

The equalization procedure may be performed at least when the BER exceeds a data error tolerance and when the data rate of the data link is increased to a higher level. In some embodiments, if a BER exceeds a data error tolerance in the fully active state (L0), the LTSSM 1200 transitions to the Recovery state in which the data link is retrained to update settings of the FIR filter 340 via an equalization procedure 1202. The full data path 302 is selected upon initiation of the equalization procedure 1202, and deselected upon termination of the equalization procedure 1202 (e.g., when the data link 106 returns to normal operation in the fully active state (L0)). In some embodiments, the data link 106 is a PCI Express 3.0 or above link, and an equalization procedure is performed when a data rate is increased. Each data channel 225 is configured to transmit data at different data rates including a first data rate (e.g., 0.5 Gbps) and a second data rate (e.g., 1 Gbps) that is higher than the first data rate. The data link 106 goes through the Detect, Polling, and Configuration states sequentially and reaches the fully active state (L0). In the fully active state (L0), data packets are transferred at the first data rate. In response to a request to boost up a data rate of the data link 106 to the second data rate, the data link 106 enters the Recovery state in which an equalization procedure 1202 is implemented to determine equalization settings of the FIR filter 340 that can support the second data rate. When the data link 106 returns to the fully active state (L0), data packets start to be transferred at the second data rate via the bit level data path 304 of the data link 106.

Figure 13:
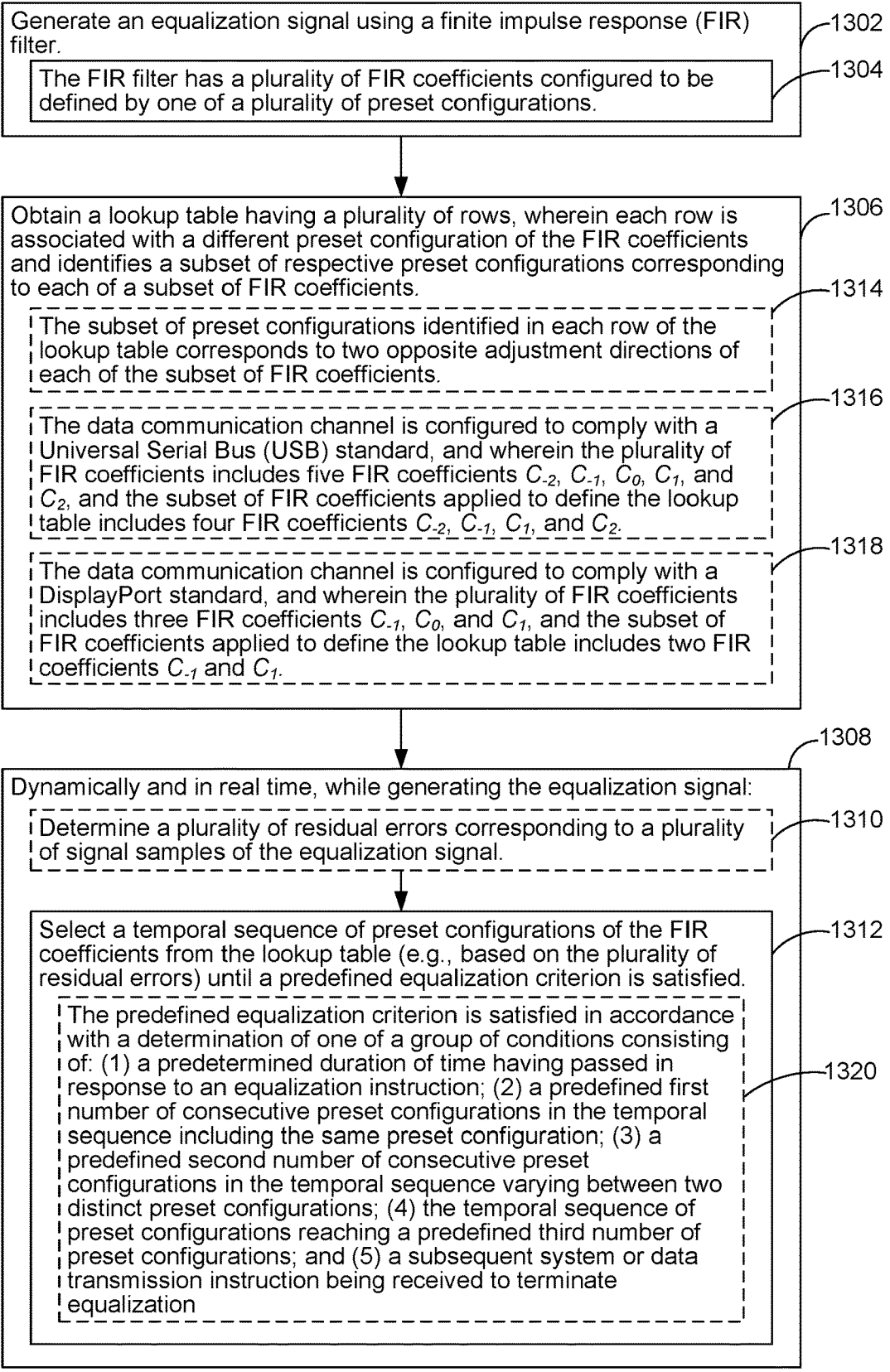
FIG. 13 is a flow diagram of an example method for adaptively setting FFE for a data communication channel, in accordance with some embodiments.

FIG. 13 is a flow diagram of an example method 1300 for adaptively setting FF) for a data communication channel, in accordance with some embodiments. For convenience, the method 1300 is described as being implemented by an electronic device (e.g., a receiver 318). The electronic device generates (1302) an equalization signal 342 using a finite impulse response (FIR) filter. The FIR filter 340 has (1304) a plurality of FIR coefficients 404 configured to be defined by one of a plurality of preset configurations 410. The electronic device obtains (1306) a lookup table 344 (FIG. 3) having a plurality of rows. Each row is associated with a different preset configuration 410 of the FIR coefficients 404 and identifies a subset of respective preset configurations 410 corresponding to a subset of FIR coefficients 404. In some implementations, dynamically and in real time, while generating the equalization signal 342 (1308), the electronic device selects (1312) a temporal sequence 360 (FIGS. 6 and 11) of preset configurations 410 of the FIR coefficients 404 from the lookup table 344 based on the plurality of residual errors 426, until a predefined equalization criterion 350 is satisfied. Alternatively, in some implementations, the electronic device determines (1310) a plurality of residual errors 426 corresponding to a plurality of signal samples of the equalization signal 342, and selects (1312) a sequence 360 (FIGS. 6 and 11) of preset configurations 410 of the FIR coefficients 404 from the lookup table 344 based on the plurality of residual errors 426.

In some embodiments, the subset of preset configurations 410 identified in each row of the lookup table 344 corresponds (1314) to two opposite update directions of each of the subset of FIR coefficients 404.

In some embodiments, the equalization signal 342 is configured to carry a stream of data bits having a data transmission rate. The electronic device samples the equalization signal 342 according to the data transmission rate to generate the plurality of signal samples. Each signal sample corresponds to a data bit of the stream of data bits and a respective residual error, and the respective residual error is determined from the signal sample with reference to the data bit.

In some embodiments, the data communication channel is configured (1316) to comply with a USB standard. The plurality of FIR coefficients 404 includes four FIR coefficients 404 ($C_{-2}$, $C_{-1}$, $C_0$, and $C_{+1}$), and the subset of FIR coefficients 404 applied to define the lookup table 344 includes three FIR coefficients 404 $C_{-2}$, $C_{-1}$, and $C_{+1}$. Further, in some embodiments, the plurality of preset configurations 410 includes 40 preset configurations 410 for the plurality of FIR coefficients 404. The lookup table 344 defines, for each preset configuration 410 of the FIR coefficients 404, six preset configurations 410 corresponding to an increase direction of $C_{-2}$, a decrease direction of $C_{-2}$, an increase direction of $C_{-1}$, a decrease direction of $C_{-1}$, an increase direction of $C_{+1}$, and a decrease direction of $C_{+1}$. In an example, referring to FIG. 9B, a current preset configuration 410C is Preset 18, and the subset of preset configurations includes Presets 18, 14, 10, 26, 17, and 19, which correspond to six different directions.

In some embodiments, the data communication channel is configured (1318) to comply with a DisplayPort standard. The plurality of FIR coefficients 404 includes three FIR coefficients 404 ($C_{-1}$, $C_0$, and $C_{+1}$), and the subset of FIR coefficients 404 applied to define the lookup table 344 includes two FIR coefficients 404 $C_{-1}$ and $C_{+1}$. Further, in some embodiments, the plurality of preset configurations 410 includes 16 preset configurations 410 for the plurality of FIR coefficients 404. The lookup table 344 defines, for each preset configuration 410 of the FIR coefficients 404, four preset configurations 410 corresponding to an increase direction of $C_{-1}$, a decrease direction of $C_{-1}$, an increase direction of $C_{+1}$, and a decrease direction of $C_{+1}$, respectively. Additionally, in some embodiments, while generating the equalization signal 342 using the FIR filter 340 operating with a first preset configuration 410-1, the electronic device samples the equalization signal 342 to obtain a set of successive signal samples including a prior signal sample, a current signal sample, and a next signal sample. Based on a stream of data bits carried by the equalization signal 342, the electronic device determines a first residual error corresponding to a first signal sample of the prior signal sample, the current signal sample, and the next signal sample. Based on the first residual error, the electronic device determines a first update direction of a first FIR coefficient of the two FIR coefficients 404 $C_{-1}$ and $C_{+1}$, the first FIR coefficient corresponding to the first signal sample. In accordance with the first update direction of the first FIR coefficient, the electronic device selects a second preset configuration 410-2 from a row associated with the first preset configuration 410-1 in the lookup table 344. Specifically, in some embodiments, based on the stream of data bits, the electronic device determines a second residual error corresponding to a second distinct signal sample of the prior signal sample, the current signal sample, and the next signal sample, and applies the second preset configuration 410-2 to the FIR filter 340. While generating the equalization signal 342 using the FIR filter 340 operating with the second preset configuration 410-2, the electronic device determines a second update direction of a second distinct FIR coefficient of the two FIR coefficients 404 ($C_{-1}$ and $C_{+1}$), the second distinct FIR coefficient corresponding to the second distinct signal sample based on the second residual error. In accordance with the second update direction of the second distinct FIR second, the electronic device selects a third preset configuration from the row associated with the first preset configuration 410-1 in the lookup table 344.

In some embodiments, after selecting each of the sequence 360 of preset configurations 410 of the FIR coefficients 404, sequentially, the electronic device applies the respective preset configuration to the FIR filter 340. A next preset configuration 410N follows the respective preset configuration 410C and is determined based on the equalization signal 342 generated using the FIR filter 340 that operates with the respective preset configuration 410C.

In some embodiments, while generating the equalization signal 342 using the FIR filter 340 operating with a first preset configuration 410-1, the electronic device samples the equalization signal 342 (FIG. 4C) to obtain a set of successive signal samples including one or more prior signal samples 342P, a current signal sample 342C, and one or more next signal samples 342N. Based on a stream of data bits carried by the equalization signal 342, the electronic device determines a first residual error (e.g., 426P) corresponding to a first signal sample of the one or more prior signal samples 342P and the one or more next signal samples 342N. Based on the first residual error, the electronic device determines a first update direction of a first FIR coefficient (e.g., $C_{-1}$) in the subset of FIR coefficients 404, and the first FIR coefficient corresponds to the first signal sample. In accordance with the first update direction of the first FIR coefficient (e.g., a $C_{-1}$ down direction), the electronic device selects a second preset configuration 410-2 from a row associated with the first preset configuration 410-1 in the lookup table 344.

Further, in some embodiments, based on the stream of data bits, the electronic device determines a second residual error corresponding to a second distinct signal sample of the one or more prior signal samples and the one or more next signal samples. The electronic device applies the second preset configuration 410-2 to the plurality of FIR coefficients 404 of the FIR filter 340. While generating the equalization signal 342 using the FIR filter 340 operating with the second preset configuration 410-2, based on the second residual error (e.g., 426N), the electronic device determines a second update direction of a second distinct FIR coefficient (e.g., $C_{+1}$) in the subset of FIR coefficients 404. The second distinct FIR coefficient (e.g., $C_{+1}$) corresponds to the second distinct signal sample (e.g., 342N). In accordance with the second update direction of the second distinct FIR coefficient (e.g., a $C_{+1}$ up direction), the electronic device selects a third preset configuration 410-3 from the row associated with the second preset configuration 410-2 in the lookup table 344.

In some embodiments, the predefined equalization criterion 350 is satisfied in accordance with a determination (1320) that a predetermined duration of time has passed in response to an equalization instruction. In some embodiments, the predefined equalization criterion 350 is satisfied in accordance with a determination that a predefined first number (e.g., 2, 3, 4) of consecutive preset configurations 410 in the temporal sequence 360 includes the same preset configuration. In some embodiments, the predefined equalization criterion 350 is satisfied in accordance with a determination that a predefined second number (e.g., 4, 6, 8) of consecutive preset configurations 410 in the temporal sequence 360 varying between two distinct preset configurations 410. In some embodiments, the predefined equalization criterion 350 is satisfied in accordance with a determination that the temporal sequence 360 of preset configurations 410 reaching a predefined third number (e.g., 10) of preset configurations 410. In some embodiments, the predefined equalization criterion 350 is satisfied in accordance with a determination that a subsequent system or data transmission instruction is received to terminate equalization.

In some embodiments, the temporal sequence 360 of preset configurations 410 includes a first total number of different preset configurations 410, and the first total number is less than a second total number of preset configurations 410 in the plurality of preset configurations 410.

In some embodiments, the data communication channel includes a transmitter 308, a receiver 318, and a data link 106, and the receiver 318 that is coupled to the transmitter 308 by the data link 106. The FIR filter 340 is included in the transmitter 308, and the equalization signal 342 is collected at an input of the receiver 318.

In some embodiments, the data communication channel includes a transmitter 308, a receiver 318, and a data link 106, and the receiver 318 that is coupled to the transmitter 308 by the data link 106. The FIR filter 340 is included in the receiver 318, and the equalization signal 342 is collected at an output of the FIR filter 340 in the receiver 318.

It should be understood that the particular order in which the operations in FIG. 13 has been described are merely exemplary and are not intended to indicate that the described order is the only order in which the operations could be performed. One of ordinary skill in the art would recognize various ways to adaptively set FFE for a data communication channel. Additionally, it should be noted that details of other processes and structures described above with respect to FIGS. 1-12 are also applicable in an analogous manner to method 1300 described above with respect to FIG. 13. For brevity, these details are not repeated here.

In some embodiments, method 1300 is, optionally, governed by instructions that are stored in a non-transitory computer readable storage medium and that are executed by one or more processors of the electronic device. Each of the operations shown in FIG. 13 may correspond to instructions stored in a computer memory or non-transitory computer readable storage medium. The computer readable storage medium may include a magnetic or optical disk storage device, solid state storage devices such as Flash memory, or other non-volatile memory device or devices. The instructions stored on the computer readable storage medium may include one or more of: source code, assembly language code, object code, or other instruction format that is interpreted by one or more processors. Some operations in method 1300 may be combined and/or the order of some operations may be changed.

It will also be understood that, although the terms first, second, etc. are, in some instances, used herein to describe various elements, these elements should not be limited by these terms. These terms are only used to distinguish one element from another. For example, a first electronic device can be termed a second electronic device, and, similarly, a second electronic device can be termed a first electronic device, without departing from the scope of the various described embodiments. The first electronic device and the second electronic device are both electronic device, but they are not the same electronic device.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The above description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method, comprising:
   generating an equalization signal using a finite impulse response (FIR) filter, wherein the FIR filter has a plurality of FIR coefficients corresponding to one of a plurality of preset configurations, each preset configuration associating the plurality of FIR coefficients with a set of predefined coefficient values;
   obtaining a lookup table having a plurality of rows, wherein in each row, a different current preset configuration of the FIR coefficients is mapped to a set of respective next preset configurations based on a subset of FIR coefficients;
   determining a plurality of residual errors corresponding to a plurality of signal samples of the equalization signal; and
   selecting a sequence of preset configurations of the FIR coefficients from the lookup table based on the plurality of residual errors.

2. The method of claim 1, wherein a subset of preset configurations identified in each row of the lookup table corresponds to two opposite update directions of each of the subset of FIR coefficients.

3. The method of claim 1, wherein the equalization signal is configured to carry a stream of data bits having a data transmission rate, the method further comprising:
   sampling the equalization signal according to the data transmission rate to generate the plurality of signal samples, wherein each signal sample corresponds to a data bit of the stream of data bits and a respective residual error of the plurality of residual errors, and the respective residual error of the plurality of residual errors is determined from the signal sample with reference to the data bit.

4. The method of claim 1, wherein a data communication channel is configured to comply with a DisplayPort standard, and wherein the plurality of FIR coefficients includes three FIR coefficients $C_{-1}$, $C_0$, and $C_{+1}$, and the subset of FIR coefficients applied to define the lookup table includes two FIR coefficients $C_{-1}$ and $C_{+1}$.

5. The method of claim 4, wherein the plurality of preset configurations includes 16 preset configurations for the plurality of FIR coefficients, and the lookup table defines, for each current preset configuration of the FIR coefficients, four next preset configurations corresponding to an increase direction of $C_{-1}$, a decrease direction of $C_{-1}$, an increase direction of $C_{+1}$, and a decrease direction of $C_{+1}$, respectively.

6. The method of claim 5, further comprising, while generating the equalization signal using the FIR filter operating with a first preset configuration:
   sampling the equalization signal to obtain a set of successive signal samples including a prior signal sample, a current signal sample, and a next signal sample;
   based on a stream of data bits carried by the equalization signal, determining a first residual error corresponding to a first signal sample of the prior signal sample, the current signal sample, and the next signal sample;
   based on the first residual error, determining a first update direction of a first FIR coefficient of the two FIR coefficients $C_{-1}$ and $C_{+1}$, the first FIR coefficient corresponding to the first signal sample; and
   in accordance with the first update direction of the first FIR coefficient, selecting a second preset configuration from a row associated with the first preset configuration in the lookup table.

7. The method of claim 6, further comprising:
   based on the stream of data bits, determining a second residual error corresponding to a second distinct signal sample of the prior signal sample, the current signal sample, and the next signal sample;
   applying the second preset configuration to the FIR filter;
   while generating the equalization signal using the FIR filter operating with the second preset configuration:
   based on the second residual error, determining a second update direction of a second distinct FIR coefficient of the two FIR coefficients $C_{-1}$ and $C_{+1}$, the second distinct FIR coefficient corresponding to the second distinct signal sample; and in accordance with the second update direction of the second distinct FIR coefficient, selecting a third preset configuration from the row associated with the second preset configuration in the lookup table.

8. The method of claim 1, further comprising:
after selecting each of the sequence of preset configurations of the FIR coefficients, sequentially applying the respective preset configuration to the FIR filter, wherein a next preset configuration follows the respective preset configuration and is determined based on the equalization signal generated using the FIR filter that operates with the respective preset configuration.

9. The method of claim 1, further comprising, while generating the equalization signal using the FIR filter operating with a first preset configuration:
sampling the equalization signal to obtain a set of successive signal samples including one or more prior signal samples, a current signal sample, and one or more next signal samples;
based on a stream of data bits carried by the equalization signal, determining a first residual error corresponding to a first signal sample of the one or more prior signal samples and the one or more next signal samples;
based on the first residual error, determining a first update direction of a first FIR coefficient in the subset of FIR coefficients, the first FIR coefficient corresponding to the first signal sample; and
in accordance with the first update direction of the first FIR coefficient, selecting a second preset configuration from a row associated with the first preset configuration in the lookup table.

10. The method of claim 9, further comprising:
based on the stream of data bits, determining a second residual error corresponding to a second distinct signal sample of the one or more prior signal samples and the one or more next signal samples;
applying the second preset configuration to the plurality of FIR coefficients of the FIR filter;
while generating the equalization signal using the FIR filter operating with the second preset configuration:
based on the second residual error, determining a second update direction of a second distinct FIR coefficient in the subset of FIR coefficients, the second distinct FIR coefficient corresponding to the second distinct signal sample; and
in accordance with the second update direction of the second distinct FIR coefficient, selecting a third preset configuration from the row associated with the second preset configuration in the lookup table.

11. The method of claim 1, wherein:
a data communication channel includes a transmitter, a receiver, and a data link, and the receiver that is coupled to the transmitter by the data link; and
the FIR filter is included in the transmitter, and the equalization signal is collected at an input of the receiver.

12. The method of claim 1, wherein:
a data communication channel includes a transmitter, a receiver, and a data link, and the receiver that is coupled to the transmitter by the data link; and
the FIR filter is included in the receiver, and the equalization signal is collected at an output of the FIR filter in the receiver.

13. An electronic system, comprising:
a finite impulse response (FIR) filter configured to generate an equalization signal, wherein the FIR filter has a plurality of FIR coefficients corresponding to one of a plurality of preset configurations, each preset configuration associating the plurality of FIR coefficients with a set of predefined coefficient values;
a memory storing a lookup table having a plurality of rows, wherein in each row, a different current preset configuration of the FIR coefficients is mapped to a set of respective next preset configurations based on a subset of FIR coefficients;
a controller coupled to the FIR filter and configured to determine a plurality of residual errors corresponding to a plurality of signal samples of the equalization signal; and
a mapping function module coupled to the controller, the FIR filter, and the memory, wherein the mapping function module is configured to select a sequence of preset configurations of the FIR coefficients from the lookup table based on the plurality of residual errors.

14. The electronic system of claim 13, wherein the FIR filter is coupled to a data communication channel that is configured to comply with a Universal Serial Bus (USB) standard, and wherein the plurality of FIR coefficients includes four FIR coefficients $C_{-2}$, $C_{-1}$, $C_0$, and $C_{+1}$, and the subset of FIR coefficients applied to define the lookup table includes three FIR coefficients $C_{-2}$, $C_{-1}$, and $C_{+1}$.

15. The electronic system of claim 14, wherein the plurality of preset configurations includes 40 preset configurations for the plurality of FIR coefficients, and the lookup table defines, for each current preset configuration of the FIR coefficients, six next preset configurations corresponding to an increase direction of $C_{-2}$, a decrease direction of $C_{-2}$, an increase direction of $C_{-1}$, a decrease direction of $C_{-1}$, an increase direction of $C_{+1}$, and a decrease direction of $C_{+1}$.

16. The electronic system of claim 13, wherein the FIR filter is coupled to a data communication channel that is configured to comply with a DisplayPort standard, and wherein the plurality of FIR coefficients includes three FIR coefficients $C_{-1}$, $C_0$, and $C_{+1}$, and the subset of FIR coefficients applied to define the lookup table includes two FIR coefficients $C_{-1}$ and $C_{+1}$.

17. The electronic system of claim 13, wherein a subset of preset configurations identified in each row of the lookup table corresponds to two opposite update directions of each of the subset of FIR coefficients.

18. A method, comprising:
generating an equalization signal using a finite impulse response (FIR) filter, wherein the FIR filter has a plurality of FIR coefficients corresponding to one of a plurality of preset configurations, each preset configuration associating the plurality of FIR coefficients with a set of predefined coefficient values;
obtaining a lookup table having a plurality of rows, wherein in each row, a different current preset configuration of the FIR coefficients is mapped to a set of respective next preset configurations based on a subset of FIR coefficients; and
dynamically and in real time, while generating the equalization signal, selecting a temporal sequence of preset configurations of the FIR coefficients from the lookup table, until a predefined equalization criterion is satisfied.

19. The method of claim 18, wherein the predefined equalization criterion is satisfied in accordance with a determination of one of a group of conditions consisting of:
a predetermined duration of time having passed in response to an equalization instruction;

a predefined first number of consecutive preset configurations in the temporal sequence including the same preset configuration;
   a predefined second number of consecutive preset configurations in the temporal sequence varying between two distinct preset configurations;
   the temporal sequence of preset configurations reaching a predefined third number of preset configurations; and
   a data transmission instruction being received to terminate an equalization procedure.

20. The method of claim 18, wherein the temporal sequence of preset configurations includes a first total number of different preset configurations, and the first total number is less than a second total number of preset configurations in the plurality of preset configurations.

* * * * *